(12) United States Patent
Kuech et al.

(10) Patent No.: US 12,725,622 B2
(45) **Date of Patent: *Sep. 1, 2026**

(54) CONCEPT FOR COMBINED DYNAMIC RANGE COMPRESSION AND GUIDED CLIPPING PREVENTION FOR AUDIO DEVICES

(71) Applicant: Fraunhofer-Gesellschaft zur Foerderung der angewandten Forschung e.V., Munich (DE)

(72) Inventors: Fabian Kuech, Erlangen (DE); Christian Uhle, Ursensollen (DE); Michael Kratschmer, Fuerth (DE); Bernhard Neugebauer, Buckenhof (DE); Michael Meier, Aurachtal (DE); Arne Borsum, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 180 days.

This patent is subject to a terminal disclaimer.

(21) Appl. No.: 18/769,966

(22) Filed: Jul. 11, 2024

(65) Prior Publication Data

US 2024/0363130 A1 Oct. 31, 2024

Related U.S. Application Data

(63) Continuation of application No. 18/148,360, filed on Dec. 29, 2022, now Pat. No. 12,051,432, which is a
(Continued)

(30) Foreign Application Priority Data

Oct. 22, 2013 (EP) .................................... 13189754

(51) Int. Cl.
*G10L 19/16* (2013.01)
*G06F 3/16* (2006.01)
(Continued)

(52) U.S. Cl.
CPC ............ *G10L 19/167* (2013.01); *G06F 3/165* (2013.01); *G10L 19/018* (2013.01);
(Continued)

(58) Field of Classification Search
CPC ... G10L 19/00; G10L 19/0017; G10L 19/002; G10L 19/008; G10L 19/012;
(Continued)

(56) References Cited

U.S. PATENT DOCUMENTS

| | | | | |
|---|---|---|---|---|
| 2005/0216262 | A1 | 9/2005 | Fejzo | |
| 2005/0246178 | A1 * | 11/2005 | Fejzo | G10L 19/008 704/E19.044 |

(Continued)

FOREIGN PATENT DOCUMENTS

| | | | |
|---|---|---|---|
| CN | 101098201 | A | 1/2008 |
| CN | 101944362 | A | 1/2011 |

(Continued)

OTHER PUBLICATIONS

Advanced Television Systems Committee (ATSC Standard): Digital Audio Compression (AC-3, E-AC-3), Dec. 17, 2012.
(Continued)

*Primary Examiner* — Leshui Zhang
(74) *Attorney, Agent, or Firm* — Perkins Coie LLP; Michael A. Glenn

(57) ABSTRACT

The invention provides a concept for combined dynamic range compression and guided clipping prevention for audio devices. An audio decoder for decoding an audio bitstream and a metadata bitstream related to the audio bitstream according to the concept includes an audio processing chain
(Continued)

including a plurality of adjustment stages including a dynamic range control stage for adjusting a dynamic range of the audio output signal and a guided clipping prevention stage for preventing clipping of the audio output signal; and a metadata decoder configured to receive the metadata bitstream and to extract dynamic range control gain sequences and guided clipping prevention gain sequences from the metadata bitstream, at least a part of the dynamic range control gain sequences being supplied to the dynamic range control stage, and at least a part of the guided clipping prevention gain sequences being supplied to the guided clipping prevention stage.

18 Claims, 5 Drawing Sheets

Related U.S. Application Data continuation of application No. 17/174,269, filed on Feb. 11, 2021, now Pat. No. 11,551,703, which is a continuation of application No. 15/136,324, filed on Apr. 22, 2016, now Pat. No. 11,170,795, which is a continuation of application No. PCT/EP2014/072431, filed on Oct. 20, 2014.

(51) Int. Cl.
*G10L 19/008* (2013.01)
*G10L 19/018* (2013.01)
*G10L 21/034* (2013.01)
*H03G 9/00* (2006.01)
*H03G 11/00* (2006.01)

(52) U.S. Cl.
CPC .......... *G10L 21/034* (2013.01); *H03G 9/005* (2013.01); *H03G 11/008* (2013.01); *G10L 19/008* (2013.01)

(58) Field of Classification Search
CPC ....... G10L 19/018; G10L 19/02; G10L 19/22; G10L 19/035; G10L 19/04; G10L 19/005; G10L 19/0208; G10L 19/16; G10L 19/167; G10L 19/173; G10L 19/18; G10L 19/24; G10L 21/0208; G10L 21/0205; G10L 21/034; G06F 3/165; G06F 3/16; H03G 9/005; H03G 9/00; H03G 11/008; H03G 11/00; H04R 3/005; H04R 3/12; H04R 25/407; H04R 27/00; H04H 60/58; G11B 2020/00057; H04S 2420/03; H04S 2420/13; H04S 1/00; H04S 2400/03; H04S 2400/11; H04N 19/00781; H04N 19/00775; H04N 21/2368; H04N 21/4394; H04N 19/00951
USPC ....... 381/1–23, 302, 303, 36, 307, 309, 310, 381/311, 320, 314, 321, 26, 61, 86, 91, 381/92, 93, 94.2, 94.3, 94.4, 94.8, 97, 98, 381/101, 102, 103, 107, 108, 120, 121, 381/77, 80; 700/94; 455/450; 704/200, 704/203, 205, 258, 263, 237, 216, 217, 704/218, 13.005, 19.005, 10.001, 19.042, 704/19.048, 500–504
See application file for complete search history.

(56) References Cited

U.S. PATENT DOCUMENTS

| | | | | |
|---|---|---|---|---|
| 2009/0063159 | A1* | 3/2009 | Crockett | G10L 19/167 704/500 |
| 2010/0083344 | A1* | 4/2010 | Schildbach | G10L 19/173 704/E21.001 |
| 2011/0110533 | A1 | 5/2011 | Choi et al. | |
| 2011/0170711 | A1 | 7/2011 | Rettelbach et al. | |
| 2011/0200197 | A1* | 8/2011 | Kim | G10L 19/0018 704/E21.001 |
| 2011/0208528 | A1* | 8/2011 | Schildbach | G10L 19/173 704/500 |
| 2012/0095580 | A1* | 4/2012 | Zhang | G10L 21/02 700/94 |
| 2012/0310654 | A1* | 12/2012 | Riedmiller | H03G 7/007 704/500 |
| 2014/0277650 | A1 | 9/2014 | Zurek et al. | |
| 2014/0294200 | A1* | 10/2014 | Baumgarte | H03G 7/007 381/107 |
| 2015/0104021 | A1* | 4/2015 | Riedmiller | G10L 19/18 381/23 |
| 2015/0332680 | A1 | 11/2015 | Crockett et al. | |

FOREIGN PATENT DOCUMENTS

| | | | |
|---|---|---|---|
| CN | 102089808 | A | 6/2011 |
| CN | 102203854 | A | 9/2011 |
| CN | 102768834 | A | 11/2012 |
| CN | 103280221 | A | 9/2013 |
| JP | 2012507059 | A | 3/2012 |
| JP | 2013055498 | A | 3/2013 |
| JP | 2016509260 | A | 3/2016 |
| JP | 2016525967 | A | 9/2016 |
| RU | 2387022 | C2 | 4/2010 |
| TW | 200921642 | A | 5/2009 |
| TW | 201010450 | A | 3/2010 |
| WO | 2014128275 | A1 | 8/2014 |
| WO | 2015038522 | A1 | 3/2015 |

OTHER PUBLICATIONS

Dolby Laboratories, Inc., “Dolby Metadata Guide”, Dolby Laboratories Inc., “Dolby Metadata Guide”, Issue 3, 2005, pp. 1-26.

Kuech, Fabian et al., “Description of the Fraunhofer IIS Submission for the DRC CfP”, 106. MPEG Meeting, Oct. 28, 2013-Nov. 1, 2013; Geneva (Motion Picture Expert Group or ISO/IEC JTC1/SC29/WG11, pp. 1-14.

Neuendorf, Max, et al., “Contribution to MPEG-H 3D Audio Version 1”, 106. MPEG Meeting; Oct. 28, 2013-Nov. 1, 2013; Genevea (Motion Picture Expert Group or ISO/IEC JTC1/SC29/WG11).Section 2.1.2, pp. 1-34.

Robinson, Charles Q, et al., “Dynamic Range Control via Metadata”, Audio Engineering Society Convention 107, Audio Engineering Society, 1999.

* cited by examiner

CONCEPT FOR COMBINED DYNAMIC RANGE COMPRESSION AND GUIDED CLIPPING PREVENTION FOR AUDIO DEVICES

CROSS-REFERENCE TO RELATED APPLICATIONS

This application is a continuation of copending U.S. patent application Ser. No. 18/148,360 filed Dec. 29, 2022, which is a continuation of U.S. patent application Ser. No. 17/174,269, filed Feb. 11, 2021 (U.S. Pat. No. 11,551,703 issued Jan. 10, 2023), which is a continuation of U.S. patent application Ser. No. 15/136,324, filed Apr. 22, 2016 (U.S. Pat. No. 11,170,795 issued Nov. 9, 2021), which is a continuation of International Application No. PCT/EP2014/072431, filed Oct. 20, 2014, which is incorporated herein by reference in its entirety, and additionally claims priority from European Application No. EP 13189754.8, filed Oct. 22, 2013, which is also incorporated herein by reference in its entirety.

BACKGROUND OF THE INVENTION

The present invention relates to a concept for combined dynamic range compression and guided clipping prevention for audio devices. In particular, the present invention relates to an audio encoder, to a method for operating an audio encoder, to a computer program for executing the method for operating an audio encoder, to an audio decoder, to a method for operating an audio decoder, and to a computer program for executing the method for operating an audio decoder.

SUMMARY

According to an embodiment, an audio decoder for decoding an audio bitstream and a metadata bitstream related to the audio bitstream may have: an audio processing chain configured to receive a decoded audio signal derived from the audio bitstream and to adjust characteristics of an audio output signal of the audio processing chain, the audio processing chain including a plurality of adjustment stages including a dynamic range control stage for adjusting a dynamic range of the audio output signal and a guided clipping prevention stage for preventing of clipping of the audio output signal at the audio decoder; a metadata decoder configured to receive the metadata bitstream and to extract dynamic range control gain sequences and guided clipping prevention gain sequences from the metadata bitstream, at least a part of the dynamic range control gain sequences being supplied to the dynamic range control stage, and at least a part of the guided clipping prevention gain sequences being supplied to the guided clipping prevention stage; and a metadata and parameter control stage configured to provide metadata and parameters to at least one of the adjustment stages on the basis of configuration information received from a configuration providing stage; wherein the guided clipping prevention stage receives the guided clipping prevention gain sequences from the metadata and parameter control stage in an uncompressed form, wherein final time-domain guided clipping prevention gain values are interpolated with a temporal resolution corresponding to the temporal resolution of the decoded audio signal, wherein the final guiding clipping prevention gains are applied to the decoded audio signal, where assignment of one of the final guided clipping prevention sequences to channels and/or objects is observed.

According to another embodiment, a method for operating an audio decoder, for decoding an audio bitstream and a metadata bitstream related to the audio bitstream, may have the steps of: deriving a decoded audio signal from the audio bitstream; using an audio processing chain including a plurality of adjusting stages for adjusting characteristics of an audio output signal of the audio processing chain including adjusting a dynamic range of the audio output signal by a dynamic range control stage, which is an adjustment stage of the audio processing chain, and preventing of clipping of the audio output signal at the audio decoder by a guided clipping prevention stage, which is an adjustment stage of the audio processing chain; receiving, on the part of a metadata decoder, the metadata bitstream and extracting dynamic range control gain sequences and guided clipping prevention gain sequences from the metadata bitstream; supplying at least a part of the dynamic range control gain sequences to the dynamic range control stage; supplying at least a part of the guided clipping prevention gain sequences to the guided clipping prevention stage; using a metadata and parameter control stage for providing metadata and parameters to at least one of the adjustment stages on the basis of configuration information received from a configuration providing stage; and using the guided clipping prevention stage for receiving the guided clipping prevention gain sequences from the metadata and parameter control stage in an uncompressed form, wherein final time-domain guided clipping prevention gain values are interpolated with a temporal resolution corresponding to the temporal resolution of the de-coded audio signal, wherein the final guiding clipping prevention gains are applied to the decoded audio signal, where assignment of one of the final guided clipping prevention sequences to channels and/or objects is observed.

Another embodiment may have a non-transitory digital storage medium having a computer program stored thereon to perform the method for operating an audio decoder, for decoding an audio bitstream and a metadata bitstream related to the audio bitstream, the method having the steps of: deriving a decoded audio signal from the audio bitstream; using an audio processing chain including a plurality of adjusting stages for adjusting characteristics of an audio output signal of the audio processing chain including adjusting a dynamic range of the audio output signal by a dynamic range control stage, which is an adjustment stage of the audio processing chain, and preventing of clipping of the audio output signal at the audio decoder by a guided clipping prevention stage, which is an adjustment stage of the audio processing chain; receiving, on the part of a metadata decoder, the metadata bitstream and extracting dynamic range control gain sequences and guided clipping prevention gain sequences from the metadata bitstream; supplying at least a part of the dynamic range control gain sequences to the dynamic range control stage; and supplying at least a part of the guided clipping prevention gain sequences to the guided clipping prevention stage; using a metadata and parameter control stage for providing metadata and parameters to at least one of the adjustment stages on the basis of configuration information received from a configuration providing stage; and using the guided clipping prevention stage for receiving the guided clipping prevention gain sequences from the metadata and parameter control stage in an uncompressed form, wherein final time-domain guided clipping prevention gain values are interpolated with a temporal resolution corresponding to the temporal resolution of the de-coded audio signal, wherein the final guiding clipping prevention gains are applied to the decoded audio signal, where assignment of one of the final guided clipping prevention sequences to channels and/or objects is observed, when said computer program is run by a computer.

An embodiment may have an audio decoder for decoding an audio bitstream and a metadata bitstream related to the audio bitstream, the audio decoder comprising: an audio processing chain configured to receive a decoded audio signal derived from the audio bitstream and to adjust characteristics of an audio output signal of the audio processing chain, the audio processing chain comprising a plurality of adjustment stages comprising a dynamic range control stage for adjusting a dynamic range of the audio output signal and a guided clipping prevention stage for preventing of clipping of the audio output signal at the audio decoder; a metadata decoder configured to receive the metadata bitstream and to extract dynamic range control gain sequences and guided clipping prevention gain sequences from the metadata bitstream, at least a part of the dynamic range control gain sequences being supplied to the dynamic range control stage, and at least a part of the guided clipping prevention gain sequences being supplied to the guided clipping prevention stage; a metadata and parameter control stage configured to provide metadata and parameters to at least one of the adjustment stages on the basis of configuration information received from a configuration providing stage; wherein the metadata and parameter control stage is configured to select parts of the metadata bitstream corresponding to the dynamic range control gain sequences to be provided to the dynamic range control stage.

Another embodiment may have a method for operating an audio decoder, for decoding an audio bitstream and a metadata bitstream related to the audio bitstream, the method having the steps of: deriving a decoded audio signal from the audio bitstream; using an audio processing chain comprising a plurality of adjusting stages for adjusting characteristics of an audio output signal of the audio processing chain comprising adjusting a dynamic range of the audio output signal by a dynamic range control stage, which is an adjustment stage of the audio processing chain, and preventing of clipping of the audio output signal at the audio decoder by a guided clipping prevention stage, which is an adjustment stage of the audio processing chain; receiving, on the part of a metadata decoder, the metadata bitstream and extracting dynamic range control gain sequences and guided clipping prevention gain sequences from the metadata bitstream; supplying at least a part of the dynamic range control gain sequences to the dynamic range control stage; supplying at least a part of the guided clipping prevention gain sequences to the guided clipping prevention stage; using a metadata and parameter control stage for providing metadata and parameters to at least one of the adjustment stages on the basis of configuration information received from a configuration providing stage; and using the metadata and parameter control stage for selecting parts of the metadata bitstream corresponding to the dynamic range control gain sequences to be provided to the dynamic range control stage.

Another embodiment may have a non-transitory digital storage medium having a computer program stored thereon to perform the method for operating an audio decoder, for decoding an audio bitstream and a metadata bitstream related to the audio bitstream, the method having the steps of: deriving a decoded audio signal from the audio bitstream; using an audio processing chain comprising a plurality of adjusting stages for adjusting characteristics of an audio output signal of the audio processing chain comprising adjusting a dynamic range of the audio output signal by a dynamic range control stage, which is an adjustment stage of the audio processing chain, and preventing of clipping of the audio output signal at the audio decoder by a guided clipping prevention stage, which is an adjustment stage of the audio processing chain; receiving, on the part of a metadata decoder, the metadata bitstream and extracting dynamic range control gain sequences and guided clipping prevention gain sequences from the metadata bitstream; supplying at least a part of the dynamic range control gain sequences to the dynamic range control stage; supplying at least a part of the guided clipping prevention gain sequences to the guided clipping prevention stage; using a metadata and parameter control stage for providing metadata and parameters to at least one of the adjustment stages on the basis of configuration information received from a configuration providing stage; and using the metadata and parameter control stage for selecting parts of the metadata bitstream corresponding to the dynamic range control gain sequences to be provided to the dynamic range control stage, when said computer program is run by a computer.

The invention provides an audio encoder for producing an audio bitstream comprising one or more audio channels and/or one or more audio objects, the audio encoder comprising a metadata encoder for producing a metadata bitstream, the audio encoder being configured:

- to receive at least one dynamic range control gain sequence for an audio frame, the dynamic range control gain sequence comprising one or more dynamic range control gains for a dynamic range control stage of an audio decoder;
- to receive at least one guided clipping prevention gain sequence for the audio frame, the guided clipping prevention gain sequence comprising one or more guided clipping prevention gains for a guided clipping prevention stage of the audio decoder; and
- to include at least one of said dynamic range control gain sequences and at least one of said guided clipping prevention gain sequences into the metadata bitstream.

The inventive concept is based on the combination of several processing blocks, which together provide the necessitated functionalities of a joint solution for dynamic range compression (DRC) and for guided clipping prevention (gCP).

The inventive concept is particularly suitable for audio systems wherein related configuration information as defined, e.g., in [M30100, M30101] is already available at the encoder and decoder. This information may be, for example, included in the header for file based transmission or in the unified speech and audio coding (USAC) configuration extension. The configuration information may include channel layouts, downmix instructions (e.g. downmix coefficients), dynamic range control instructions (e.g. applied dynamic range control characteristic, number of dynamic range control gain sequences for a track), and loudness information (e.g. program loudness, anchor loudness, true peak value). More details can be found in [M30100, M30101]. The same applies to corresponding guided clipping prevention instructions, which may be handled in the same manner as the information of the dynamic range control instructions box.

The audio encoder according to the invention is capable of producing a metadata bitstream which comprises dynamic range control gain sequences for a dynamic range control stage of an audio decoder as well as guided clipping prevention gain sequences for a guided clipping prevention stage of the audio decoder, wherein the dynamic range control gain sequences may be transmitted separately from the guided clipping prevention gain sequences.

The metadata encoder uses, as input, dynamic range control gain sequences that are provided externally, e.g., by an external tool operated by a content provider.

The possible temporal resolution of the dynamic range control gains may be in the range of a few samples. The dynamic range control gain values may usually be represented with sufficient resolution of up to 0.125 dB.

Additionally, the metadata encoder takes guided clipping prevention gain sequences as input.

The compressed dynamic range control gain sequences and guided clipping prevention gain sequences may be transmitted to the receiver as side information included in the unified speech and audio coding extension payload.

It should be noted that dynamic range control gain sequences should only include dynamic range control gains to perform dynamic range compression, whereas guided clipping prevention gains for clipping prevention are accommodated by the guided clipping prevention gains sequences.

The temporal resolution of the guided clipping prevention gains may be the same as for the dynamic range control gains.

Signal clipping at the decoder side can occur e.g. due to loudness normalization, downmixing, parametric coding tools, etc.

Clipping prevention can, according to conventional technology, be achieved by placing a peak limiter at the final end of the decoder processing chain. A peak limiter detects audio samples in the input signal that exceed a defined maximum value, and applies a level reduction to the respective signal portions so that the samples of the output signal stay below the defined maximum value. To prevent audible distortions, the level reduction has to be performed gradually, i.e. the gain factor applied to the signal may only change slowly over time, which is ensured by a gain smoothing filter. A look-ahead delay of the input signal before applying the gain factor is also used to allow for a smooth reduction of the gain starting already before a sudden signal peak. Since a decoder side peak limiter is usually not controlled from the encoder side (a content creator has no influence on the peak limiter processing), it produces an unguided clipping prevention gain sequence which is directly applied to the audio signal. A decoder side peak limiter causes additional look-ahead delay (about 5 ms or more) and computational complexity at the decoder side.

In contrast to that, guided clipping prevention gain sequences as used according to the invention allow to fully control the generation of clipping prevention gains at the encoder side (if desired, a content creator can have influence on the gain characteristics). After generation, the clipping prevention gain sequences are transmitted to the decoder side. If a suitable guided clipping prevention gain sequence for the current decoder configuration is available in the metadata bitstream, a decoder side peak limiter can be avoided in most cases. Thus, additional look-ahead delay and computational complexity at the decoder side can be avoided.

Guided clipping prevention gain sequences can be transmitted for various decoder configurations like, e.g. for specific target loudness levels or for specific downmix configurations. If the decoder configuration matches, a suitable guided clipping prevention gain sequence can be applied to the decoder output signal. In many cases guided clipping prevention gain sequences can be optionally scaled to match a non-matching target loudness level (signal headroom is used as far as possible).

The guided clipping prevention gain sequences are used to assure that no sample clipping occurs at the output of the audio decoder for a specific target level and downmix/format converter configuration. Each guided clipping prevention gain sequence may be optimized for a combination of a specific downmix/format converter configuration, a specific target level, and a specific dynamic range control gain sequence for channels together with specific dynamic range control gain sequences for the objects. The information about which guided clipping prevention gain sequence is associated with which dynamic range control gain sequence may be included in the guided clipping prevention instruction contained in the file header of the unified speech and audio coding configuration extension. It may also include the information related to the target level for which the guided clipping prevention gains have been determined at the encoder.

The inventive concept for dynamic range processing that is described above represents an approach to encoder side control of the entire processing chain. The separation of the metadata used for dynamic range control and guided clipping prevention allows for separate modification (scaling or mapping) of each of the gains, said modification depending on the decoder configuration and the playback scenario.

With the inventive concept it is possible to change the underlying dynamic range control characteristic of a dynamic range control gain sequence from heavy compression to light compression if the dynamic range control gains are transmitted separately from the guided clipping prevention gains. This can be achieved by means of appropriate scaling or mapping of the values of the dynamic range control gain sequence.

The inventive concept gives the content provider full control of the final output of the audio decoder in order to meet given quality requirements. In this case, both dynamic range control gain sequences and guided clipping prevention gain sequences can be included for specific decoder configurations considered to be most important. A peak limiter may be discarded in many cases due to combined use of dynamic range control gain sequences and guided clipping prevention gain sequences. It has to be noted that guided clipping prevention at the audio decoder side, which is achieved by simply applying guided clipping prevention gains, is computationally more efficient than using a peak limiter.

According to an embodiment of the invention the metadata encoder is configured to receive at least two dynamic range control gain sequences for the same audio frame comprising different dynamic range control gains, and to include the at least two dynamic range control gain sequences comprising the different dynamic range control gains into the metadata bitstream.

The information about which dynamic range control characteristics are associated with the different dynamic range control gain sequences may be included in the dynamic range control instruction contained in the file header in case of file based delivery or in the unified speech and audio coding configuration extensions.

By means of these features it is possible to provide multiple dynamic range control gain sequences for the channels of an audio track in order to enable output signals at the decoder which have different compression characteristics.

According to an embodiment of the invention the metadata encoder is configured to receive a dynamic range control gain sequence comprising at least two dynamic range control gains related to different audio channels and/or to different audio objects, the metadata encoder being configured to include the at least two dynamic range control gains related to different audio channels and/or to different audio objects and, optionally, the relationships of the dynamic range control gains to the audio channels and/or the audio objects into the metadata bitstream.

Within each dynamic range control sequence it is possible to define a set of different dynamic range control gains for different channels or groups of channels, each channel usually being associated with exactly one channel group. For example, in multi-channel movie sound it is often desired to apply a specific dynamic range control gain to the dialog channel. The remaining channels such as front left, front right, rear left, rear right, for example, may be processed by using a different dynamic range control gain.

By analogy with the channel case, multiple dynamic range control sequences that are associated with audio objects or groups of objects can be supported. These object-related dynamic range control sequences can also be considered as being associated with a specific channel group within a channel-related set of dynamic range control gains. The term audio objects herein relates to single source sounds such as a door bell.

The information about which dynamic range control characteristics are associated with the different dynamic range control gain sequences may be included in the dynamic range control instruction contained in the file header in case of file based delivery or in the unified speech and audio coding configuration extensions.

According to an embodiment of the invention the metadata encoder is configured to receive a dynamic range control gain sequence comprising at least two dynamic range control gains related to different frequency bands of the audio decoder, the metadata encoder being configured to include the at least two dynamic range control gains related to different frequency bands of the decoder and, optionally, the relationships of the dynamic range control gains to the frequency bands of the decoder into the metadata bitstream.

In an optional extension supporting multi-band dynamic range control, the metadata encoder can be extended to also accept dynamic range control gain sequences having different dynamic range control gains for different frequency bands as input.

The information about which dynamic range control characteristics are associated with the different dynamic range control gain sequences may be included in the dynamic range control instruction contained in the file header in case of file based delivery or in the unified speech and audio coding configuration extensions.

According to an embodiment of the invention the metadata encoder is configured to receive at least two guided clipping prevention gain sequences comprising different guided clipping prevention gains and to include the at least two guided clipping prevention gain sequences comprising the different guided clipping prevention gains into the metadata bitstream.

According to an embodiment of the invention each dynamic range control sequence is related to one of the guided clipping prevention gain sequences, the metadata encoder being configured to include relationships between the dynamic range control sequences and the guided clipping prevention gain sequences into the metadata bitstream.

According to an embodiment of the invention the metadata encoder is configured to receive a guided clipping prevention gain sequence comprising at least two guided clipping prevention gains related to different audio channels and/or to different audio objects, the metadata encoder being configured to include the guided clipping prevention sequence comprising the at least two guided clipping prevention gains related to different audio channels and/or to different audio objects and, optionally, the relationships of the guided clipping prevention gains to the audio channels and/or the audio objects into the metadata bitstream.

As with the dynamic range control gains, it is possible to define a set of different guided clipping prevention gains for different channels or groups of channels within each guided clipping prevention sequence, where each channel usually is associated with exactly one channel group. In typical operation modes the same guided clipping prevention gains are applied to all channels.

The definitions of guided clipping prevention gain sequences for objects are analogous to the dynamic range control case.

In another aspect the invention provides a method for operating an audio encoder for producing an audio bitstream comprising one or more audio channels and/or one or more audio objects, the audio encoder comprising a metadata encoder for producing a metadata bitstream, the method comprising the steps of:

receiving, on the part of the metadata encoder, at least one dynamic range control gain sequence comprising one or more dynamic range control gains for a dynamic range control stage of an audio decoder;

receiving, on the part of the metadata encoder, at least one guided clipping prevention gain sequence comprising one or more guided clipping prevention gains for a guided clipping prevention stage of the audio decoder; and including, on the part of the metadata encoder, at least one of said dynamic range control gain sequences and at least one of said guided clipping prevention gain sequences into the metadata bitstream.

In a further aspect the invention provides a computer program for performing, when running on a computer or a processor, the before-mentioned method.

In a further aspect the invention provides an audio decoder for decoding an audio bitstream and a metadata bitstream related to the audio bitstream, which are produced in particular by an audio encoder according to the present invention, the audio decoder comprising:

an audio processing chain configured to receive a decoded audio signal derived from the audio bitstream and to adjust characteristics of an audio output signal of the audio processing chain, the audio processing chain comprising a plurality of adjustment stages including a dynamic range control stage for adjusting a dynamic range of the audio output signal and a guided clipping prevention stage for preventing of clipping of the audio output signal; and a metadata decoder configured to receive the metadata bitstream and to extract dynamic range control gain sequences and guided clipping prevention gain sequences from the metadata bitstream, at least a part of the dynamic range control gain sequences being supplied to the dynamic range control stage, and at least a part of the guided clipping prevention gain sequences being supplied to the guided clipping prevention stage.

The metadata decoder receives the metadata bitstream containing the compressed dynamic range control gain sequences and guided clipping prevention gain sequences, for example from a unified speech and audio coding decoder.

The metadata decoder generates the desired dynamic range control gain sequence from the compressed metadata bitstream. Additionally, scaling or mapping of the resulting dynamic range control gains may be applied.

The metadata decoder additionally generates the desired guiding clipping prevention gain sequence from the bitstream containing compressed guided clipping prevention metadata. Scaling or mapping of the guided clipping prevention gains can be applied. This is especially useful if the audio decoder target level is lower than the target level that has been used for determining the guided clipping prevention gains sequence at the audio encoder. Then, mapping of the guided clipping prevention gains is possible, which optimally restores signal headroom while still assuring that no clipping occurs at the audio decoder output signal.

The dynamic range control stage receives the uncompressed and optionally scaled or mapped dynamic range control gain sequences for each audio frame directly or indirectly from the metadata decoder. The metadata decoder also may ensure that the final time-domain dynamic range control gain values are interpolated with a temporal resolution corresponding to the temporal resolution of the audio samples. These final dynamic range control gains are then applied to the decoded audio signal, where assignment of a certain dynamic range control sequence to the correct channel or object group is observed.

The guided clipping prevention stage receives the uncompressed and optionally scaled or mapped guided clipping prevention gain sequences for each audio frame directly or indirectly from the metadata decoder. The metadata decoder also may ensure that the final time-domain guided clipping prevention gain values are interpolated with a temporal resolution corresponding to the temporal resolution of the audio samples. These final guiding clipping prevention gains are then applied to the decoded audio signals, where assignment of a certain guided clipping prevention sequence to the correct channel group is observed.

The invention provides flexibility at the audio decoder side while leaving the control of the entire processing chain at the encoder side. The separation of the metadata used for dynamic range control and guided clipping prevention allows for separate modification (scaling or mapping) of each of the gains, said modification depending on the audio decoder configuration and the playback scenario.

The invention allows changing the underlying dynamic range control characteristic of a dynamic range control gain sequence from heavy compression to light compression if the dynamic range control gains are transmitted separately from the guided clipping prevention gains. This can be achieved by means of appropriate scaling or mapping of the values of the dynamic range control gain sequence.

In the event that the decoder target level is lower than the target level used for computing the gains for guided clipping prevention at the encoder, a reduced attenuation of signal peaks can be allowed at the decoder by appropriately scaling the guided clipping prevention gains. Then, the level of strong signal peaks can be maintained or at least increased as compared to the case of applying the guided clipping prevention gains in an unmodified manner, which means that available headroom can be preserved.

According to an embodiment of the invention the metadata decoder is configured to extract from the metadata bitstream at least two dynamic range control gain sequences for the same audio frame comprising different dynamic range control gains.

The information about which dynamic range control characteristics are associated with the different dynamic range control gain sequences may be included in the dynamic range control instruction contained in the file header in case of file based delivery or in the unified speech and audio coding configuration extensions.

By means of these features it is possible to provide multiple dynamic range control gain sequences for the channels of an audio track in order to enable output signals at the decoder which have different compression characteristics.

According to an embodiment of the invention the metadata decoder is configured to extract from the metadata bitstream a dynamic range control gain sequence comprising at least two dynamic range control gains related to different audio channels and/or to different audio objects.

Within each dynamic range control sequence it is possible to define a set of different dynamic range control gains for different channels or groups of channels, each channel usually being associated with exactly one channel group. For example, in multi-channel movie sound it is often desired to apply a specific dynamic range control gain to the dialog channel. The remaining channels such as front left, front right, rear left, rear right, for example, may be processed by using a different dynamic range control gain.

By analogous with the channel case, multiple dynamic range control sequences that are associated with audio objects or groups of objects can be supported. These object-related dynamic range control sequences can also be considered as being associated with a specific channel group within a channel-related set of dynamic range control gains. The term audio objects herein relates to single source sounds such as a door bell.

According to an embodiment of the invention the metadata decoder is configured to extract from the metadata bitstream a dynamic range control gain sequence comprising at least two dynamic range control gains related to different frequency bands of the audio decoder.

In an optional extension supporting multi-band dynamic range control, the metadata decoder can be extended to also accept dynamic range control gain sequences having different dynamic range control gains for different frequency bands as input.

In case of multi-band dynamic range control extension, the time-domain audio signal has to be transformed into the appropriate frequency domain representation before applying multi-band dynamic range control gains.

The information about which dynamic range control characteristics are associated with the different dynamic range control gain sequences may be included in the dynamic range control instruction contained in the file header in case of file based delivery or in the unified speech and audio coding configuration extensions.

According to an embodiment of the invention the metadata decoder is configured to extract from the metadata bitstream at least two guided clipping prevention gain sequences comprising different guided clipping prevention gains.

By means of these features it is possible to provide multiple guided clipping prevention gain sequences for an audio track in order to match the corresponding dynamic range control gain sequences.

According to an embodiment of the invention the metadata decoder is configured to extract from the metadata bitstream a guided clipping prevention gain sequence comprising at least two guided clipping prevention gains related to different audio channels and/or to different audio objects.

As with the dynamic range control gains, it is possible to define a set of different guided clipping prevention gains for different channels or groups of channels within each guided clipping prevention sequence, where each channel usually is associated with exactly one channel group. In typical operation modes the same guided clipping prevention gains are applied to all channels.

The definitions of guided clipping prevention gain sequences for objects are analogous to the dynamic range control case.

According to an embodiment of the invention the audio decoder further comprises a metadata and parameter control stage configured to provide metadata and parameters to at least one of the adjustment stages on the basis of configuration information received from a configuration providing stage.

The metadata and parameter control stage at the audio decoder may select the correct part of the metadata bitstream in accordance with the desired dynamic range control gain sequences. The scaling and mapping information can also be part of or derived from the decoder configuration information.

By analogy, the metadata and parameter control stage at the audio decoder selects the correct part of the bitstream in accordance with the desired guided clipping prevention gain sequences.

According to an embodiment of the invention the metadata and parameter control stage is configured to select, in the event that a plurality of dynamic range control gain sequences are received, which of the plurality of dynamic range control gain sequences is supplied to the dynamic range control stage. The selection of the dynamic range control sequence on the part of the metadata and parameter control stage can be based on the decoder configuration information such as channel layout, downmix instructions, object metadata, dynamic range control instructions, loudness information, and decoder target level.

According to an embodiment of the invention the metadata and parameter control stage is configured to select, in the event that a plurality of guided clipping prevention gain sequences is received, which of the plurality of guided clipping prevention gain sequences is supplied to the guided clipping prevention stage.

The selection of the guided clipping prevention gain sequence on the part of the metadata and parameter control block is usually based on audio decoder configuration information described above.

According to an embodiment of the invention the dynamic range control stage in the direction of the signal flow is the first adjustment stage of the audio adjustment chain.

Dynamic range control processing for channels may be performed before a potential downmixing or format conversion of the decoded audio channels in order to enable different gaining for the channel groups. Accordingly, the dynamic range control gains are applied to the objects before rendering. In the event that both—channels and objects—are present, the location of the dynamic range control processing remains the same: the channel related dynamic range control should be performed directly before the format converter stage, whereas the object related dynamic range control is performed before the object renderer.

According to an embodiment of the invention the audio adjustment chain comprises a format converter stage configured to adjust a channel configuration of the audio output signal. The format converter stage, also referred to as downmixer (DMX), is configured to adapt the channel configuration of the audio output signal to the transducers used for playback. For example, the format converter stage may convert a 5.1 surround signal into a stereo signal.

According to an embodiment of the invention the audio adjustment chain comprises a loudness normalization stage configured to normalize the loudness of the audio output signal.

The loudness normalization stage may scale its audio input signal such that the output signal has the correct target loudness level. The scaling factor is derived from the difference between the program reference level (PRL) and the decoder target level (DTL) and provided by the decoder's metadata and parameter control to the loudness normalization block. The program reference level may be obtained from the loudness information which is included, e.g., in the file header, whereas the decoder target level is a decoder configuration parameter. It is possible that multiple program reference level values are provided within the loudness information, where each corresponds to a specific configuration of an applied dynamic range control sequence and/or an applied downmix. In this case, the metadata and parameter control stage chooses the correct program reference level value while considering the given audio decoder configuration. The location of the loudness-processing step depends on the actual output configuration of the audio decoder. In general, the loudness normalization should be performed on the output channels of the audio decoder, e.g. after the mixer, or after format conversion, if applicable.

According to an embodiment of the invention the audio adjustment chain comprises a peak limiter stage configured to limit peaks of the audio output signal in the event that a threshold is exceeded.

According to an embodiment of the invention the peak limiter stage in the direction of the signal flow is the last adjustment stage of the audio adjustment chain.

There are a number of potential sources of unavoidable sample clipping in the audio processing chain of a typical audio decoder, including:

Parametric coding tools

Binaural processing

Downmixing, format conversion, rendering

Loudness normalization (especially for high target levels)

Quantization at the decoder output

The peak limiter stage is therefore placed at the very end of the processing chain of the audio decoder to prevent any undesired clipping of the audio samples, e.g. just before the time domain output signal is converted from the floating point to the fixed point pulse code modulation format (PCM format). This also means that any dynamic range control stage and loudness normalization stage described in the previous section is located before the peak limiter stage. In the context of MPEG-H 3D Audio [M30324], the peak limiter stage receives different signals as input, depending on the actual playback configuration. In case of binaural rendering, the two output channels for the headphones may be processed by the peak limiter stage. If the output channels of the mixer are played back directly, the peak limiter stage may process the corresponding loudspeaker channels. The same applies if the mixer output channels are converted to a different loudspeaker configuration (e.g. downmixed) by the format converter first.

The peak limiter stage may detect audio samples in the time-domain signal that exceed the limiting threshold, and applies a level reduction to the respective signal portions so that the samples of the audio output signal stay below the limiting threshold. To prevent audible distortions, the level reduction should be performed gradually, i.e. the gain factor applied to the signal may only change slowly over time, which is ensured by a gain smoothing filter. A look-ahead delay of the input signal of the peak limiter stage before applying the limiter gain factor is also used in order to allow for a smooth reduction of the gain starting already before sharp signal peaks. The delay can be adjusted to a given requirement, a practical choice being 5 ms. In case of multi-channel audio a common gain factor may be applied to all audio channels to reduce computational complexity.

The information about the maximum peak of the audio signal, which may be included in the loudness information of a file header, can be exploited to discard the peak limiter stage if the decoder configuration implies that no clipping can occur in the audio processing chain. The peak limiter stage may also be discarded, e.g., if the audio decoder outputs audio samples with floating point precision and a clipping prevention is performed at a later point in the audio chain of the playback device. Obviously, if the decoder configuration for a given playback scenario allows application of correct guided clipping prevention gains, the peak limiter stage may also be disabled if no additional codec clipping occurs.

The peak limiter may be considered as being an essential component in practice. There are numerous sources of clipping within the audio processing chain of the decoder. Special configurations may be covered by providing guided clipping prevention gain sequences. However, for flexible operation of the decoder, the peak limiter may be provided to assure that no clipping occurs.

According to an embodiment of the invention the audio adjustment chain comprises an object renderer stage configured to mix audio objects into channels of the audio output signal.

According to an embodiment of the invention the audio adjustment chain comprises a transducer adaption stage configured to adjust characteristics of the audio output signal to a transducer system used for reproducing the audio output signal.

In order to reduce the necessitated limiting strength of the peak limiter stage, a frequency dependent transducer adaptation processing, e.g. implemented by an equalization filter, can be included in the processing chain.

The transducer adaptation stage receives an audio input signal and information about the characteristics of the transducer used for reproduction (loudspeaker or headphones).

The task of the transducer adaption stage is to adapt the audio output signal to the transducer characteristics, especially when transducers have a limited frequency range and thereby will limit the frequency range of the audio output signal. By limiting the frequency range by using appropriate filters mimicking the transfer function of the transducer prior to the peak limiting stage, the input signal of the peak limiter stage is reduced in level. As a consequence, signal peaks that exceed the limiting thresholds are reduced in level. Consequently, the effect of the peak limiting stage is less severe. This is advantageous because

- peak limiting can audibly change the signal, whereas the transducer adaptation does not introduce audible changes into the signal, and
- when signals are modified such that the maximum peak level is below the limiting threshold, the peak limiter will introduce less computational load.

In addition to the filtering, the transducer adaptation stage can also include signal-adaptive processing such that the band-limiting of the transducer is compensated for. Especially very small transducers are not capable of reproducing low-frequency signals.

This can be compensated for by increasing the perceived bass response of the transducer, e.g. by artificially generating and adding harmonics of the low-frequency notes to the signal.

In a further aspect the invention provides a method for operating an audio decoder, in particular an audio decoder according to the claims, for decoding an audio bitstream and a metadata bitstream related to the audio bitstream, which are produced in particular by an audio encoder according to one of claims 1 to 9, the method comprising the steps of:

- deriving a decoded audio signal from the audio bitstream;
- using an audio processing chain having a plurality of adjusting stages for adjusting characteristics of an audio output signal of the audio processing chain including adjusting a dynamic range of the audio output signal by a dynamic range control stage, which is an adjustment stage of the adjustment chain, and preventing of clipping of the audio output signal by a guided clipping prevention stage, which is an adjustment stage of the adjustment chain;
- receiving, on the part of a metadata decoder, the metadata bitstream and extracting dynamic range control gain sequences and guided clipping prevention gain sequences from the metadata bitstream;
- supplying at least a part of the dynamic range control gain sequences to the dynamic range control stage; and
- supplying at least a part of the guided clipping prevention gain sequences to the guided clipping prevention stage.

In a further aspect the invention provides a computer program for performing, when running on a computer or a processor, the before-mentioned method.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
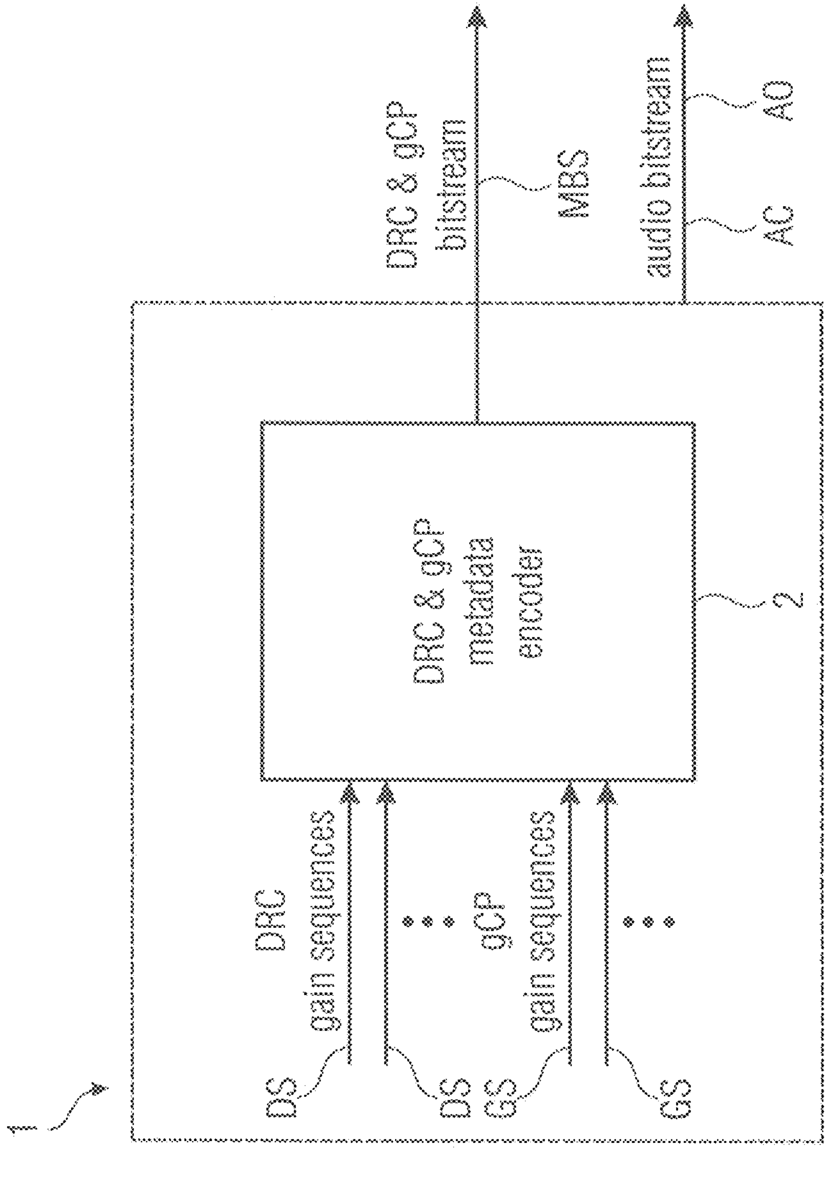
FIG. 1 illustrates an embodiment of an audio encoder according to the invention in a schematic view.

FIG. 1 illustrates an embodiment of an audio encoder 1 according to the invention in a schematic view. FIG. 1 illustrates encoding of the dynamic range control gain sequences and guided clipping prevention gain sequences.

The audio encoder 1 is configured to produce an audio bitstream comprising one or more audio channels AC and/or one or more audio objects AO, the audio encoder 1 comprising a metadata encoder 2 for producing a metadata bitstream MBS configured:

- to receive at least one dynamic range control gain sequence DS for an audio frame comprising one or more dynamic range control gains for a dynamic range control stage 5 (see FIG. 2) of an audio decoder 3 (see FIG. 2);
- to receive at least one guided clipping prevention gain sequence GS for the audio frame, said guided clipping prevention gain sequence GS comprising one or more guided clipping prevention gains for a guided clipping prevention stage 6 (see FIG. 2) of the audio decoder 3; and
- to include at least one of said dynamic range control gain sequences DS and at least one of said guided clipping prevention gain sequences GS into the metadata bitstream MBS.

The inventive concept is based on the combination of several processing blocks, which together provide the necessitated functionalities of a joint solution for dynamic range compression (DRC) and guided clipping prevention (gCP).

The inventive concept is particularly suitable for audio systems wherein related configuration information as defined, e.g., in [M30100, M30101] is already available at the audio encoder 1 and at the audio decoder 3. This information may be included, for example, in the header for file based transmission or in the unified speech and audio coding (USAC) configuration extension. The configuration information may include channel layouts, downmix instructions (e.g. downmix coefficients), dynamic range control instructions (e.g. applied dynamic range control characteristic, number of dynamic range control gain sequences for a track), and loudness information (e.g. program loudness, anchor loudness, true peak value). More details can be found in [M30100, M30101]. The same applies to corresponding guided clipping prevention instructions, which may be handled in the same manner as the information of the dynamic range control instructions box.

The audio encoder 1 according to the invention is capable of producing a metadata bitstream MBS which comprises dynamic range control gain sequences DS for a dynamic range control stage 5 of an audio decoder 3 as well as guided clipping prevention gain sequences GS for a guided clipping prevention stage 6 of the audio decoder 3, wherein the dynamic range control gain sequences DS may be transmitted separately from the guided clipping prevention gain sequences GS.

The metadata encoder uses, as input, dynamic range control gain sequences DS that are provided externally, e.g., by an external tool operated by a content provider.

The possible temporal resolution of the dynamic range control gains may be in the range of a few samples. The dynamic range control gain values may usually be represented with sufficient resolution of up to 0.125 dB.

Additionally, the metadata encoder takes guided clipping prevention gain sequences GS as input.

The compressed dynamic range control gain sequences DS and guided clipping prevention gain sequences GS may be transmitted to the receiver as side information included in the unified speech and audio coding extension payload.

It should be noted that dynamic range control gain sequences DS should only include dynamic range control gains to perform dynamic range compression, whereas guided clipping prevention gains for clipping prevention are accommodated by the guided clipping prevention gains sequences GS.

The temporal resolution of the guided clipping prevention gains may be the same as for the dynamic range control gains.

The guided clipping prevention gain sequences GS are used to assure that no sample clipping occurs at the audio output signal AOS (see FIG. 2) of the audio decoder 3 for a specific target level and downmix/format converter configuration. Each guided clipping prevention gain sequence GS may be optimized for a combination of a specific downmix/format converter configuration, a specific target level, and a specific dynamic range control gain sequence for channels together with specific dynamic range control gain sequences for the objects. The information about which guided clipping prevention gain sequence GS is associated with which dynamic range control gain sequence DS may be included in the guided clipping prevention instruction contained in the file header of the unified speech and audio coding configuration extension. It may also include the information related to the target level for which the guided clipping prevention gains have been determined at the audio encoder 1.

Figure 2:
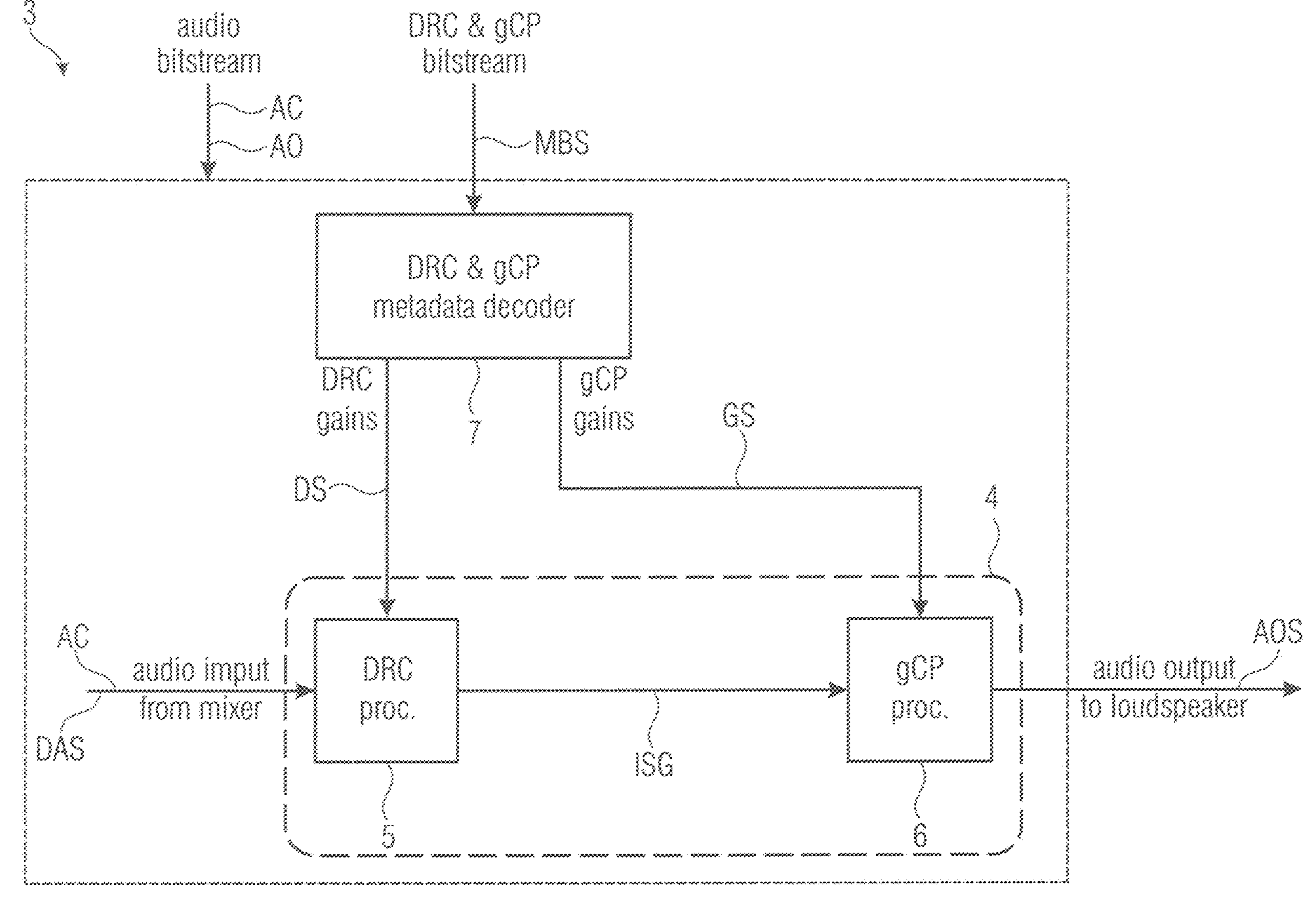
FIG. 2 illustrates a first embodiment of an audio decoder according to the invention in a schematic view.

The inventive concept for dynamic range processing described above represents an approach to audio encoder side control of the entire audio processing chain 4 (see FIG. 2). The separation of the metadata used for dynamic range control and guided clipping prevention allows for separate modification (scaling or mapping) of each of the gains, said modification depending on the audio decoder configuration and the playback scenario.

With the inventive concept it is possible to change the underlying dynamic range control characteristic of a dynamic range control gain sequence DS from heavy compression to light compression if the dynamic range control gains are transmitted separately from the guided clipping prevention gains GS. This can be achieved by means of appropriate scaling or mapping of the values of the dynamic range control gain sequence DS.

The inventive concept gives the content provider full control of the final audio output signal AOS of the audio decoder 3 in order to meet given quality requirements. In this case, both dynamic range control gain sequences DS and guided clipping prevention gain sequences GS can be included for specific audio decoder configurations considered to be most important. A peak limiter stage 12 may be discarded in many cases due to combined use of dynamic range control gain sequences DS and guided clipping prevention gain sequences GS. It has to be noted that guided clipping prevention at the audio decoder side, which is achieved by simply applying guided clipping prevention gains, is computationally more efficient than using a peak limiter 12.

According to an embodiment of the invention the metadata encoder 2 is configured to receive at least two dynamic range control gain sequences DS for the same audio frame comprising different dynamic range control gains, and to include the at least two dynamic range control gain sequences DS comprising the different dynamic range control gains into the metadata bitstream MBS.

The information about which dynamic range control characteristics are associated with the different dynamic range control gain sequences DS may be included in the dynamic range control instruction contained in the file header in case of file based delivery or in the unified speech and audio coding configuration extensions.

By means of these features it is possible to provide multiple dynamic range control gain sequences DS for the channels of an audio track in order to enable output signals at the audio decoder 3 which have different compression characteristics.

According to an embodiment of the invention the metadata encoder is configured to receive a dynamic range control gain sequence DS comprising at least two dynamic range control gains related to different audio channels AC and/or to different audio objects AO, the metadata encoder 2 being configured to include the at least two dynamic range control gains DS related to different audio channels AC and/or to different audio objects AO and, optionally, the relationships of the dynamic range control gains to the audio channels AC and/or the audio objects AO into the metadata bitstream MBS.

Within each dynamic range control sequence DS it is possible to define a set of different dynamic range control gains for different audio channels AC or groups of audio channels AC, wherein each audio channel AC usually is associated with exactly one channel group. For example, in multi-channel movie sound it is often desired to apply a specific dynamic range control gain to the dialog channel. The remaining channels such as front left, front right, rear left, rear right, for example, may be processed by using a different dynamic range control gain.

By analogy with the channel case, multiple dynamic range control sequences DS that are associated with audio objects AO or groups of objects AO can be supported. These object-related dynamic range control sequences DS can also be considered as being associated with a specific channel group within a channel-related set of dynamic range control gains. The term audio objects herein relates to single source sounds such as a door bell.

The information about which dynamic range control characteristics are associated with the different dynamic range control gain sequences DS may be included in the dynamic range control instruction contained in the file header in case of file based delivery or in the unified speech and audio coding configuration extensions.

According to an embodiment of the invention the metadata encoder 2 is configured to receive a dynamic range control gain sequence DS comprising at least two dynamic range control gains related to different frequency bands of the audio decoder, the metadata encoder 2 being configured to include the at least two dynamic range control gains DS related to different frequency bands of the audio decoder 3 and, optionally, the relationships of the dynamic range control gains to the frequency bands of the audio decoder 3 into the metadata bitstream MBS.

In an optional extension supporting multi-band dynamic range control, the metadata encoder 2 can be extended to also accept, as input, dynamic range control gain sequences DS having different dynamic range control gains for different frequency bands.

The information about which dynamic range control characteristics are associated with the different dynamic range control gain sequences DS may be included in the dynamic range control instruction contained in the file header in case of file based delivery or in the unified speech and audio coding configuration extensions.

According to an embodiment of the invention the metadata encoder is configured to receive at least two guided clipping prevention gain sequences GS comprising different guided clipping prevention gains and to include the at least two guided clipping prevention gain sequences GS comprising the different guided clipping prevention gains into the metadata bitstream MBS.

According to an embodiment of the invention each dynamic range control sequence DS is related to one of the guided clipping prevention gain sequences GS, the metadata encoder 2 being configured to include relationships between the dynamic range control sequences DS and the guided clipping prevention gain sequences GS into the metadata bitstream MBS.

According to an embodiment of the invention the metadata encoder is configured to receive a guided clipping prevention gain sequence GS comprising at least two guided clipping prevention gains related to different audio channels AC and/or to different audio objects AO, the metadata encoder 2 being configured to include the guided clipping prevention sequence GS comprising the at least two guided clipping prevention gains related to different audio channels AC and/or to different audio objects AO and, optionally, the relationships of the guided clipping prevention gains to the audio channels AC and/or the audio objects AO into the metadata bitstream MBS.

As with the dynamic range control gains, it is possible to define a set of different guided clipping prevention gains for different audio channels AC or groups of audio channels AC within each guided clipping prevention sequence GS, where each audio channel AC usually is associated with exactly one audio channel group. In typical operation modes the same guided clipping prevention gains are applied to all audio channels AC.

The definitions of guided clipping prevention gain sequences for audio objects AO are analogous to the dynamic range control case.

In another aspect the invention provides a method for operating an audio encoder 1 for producing an audio bitstream comprising one or more audio channels and/or one or more audio objects, the audio encoder comprising a metadata encoder 2 for producing a metadata bitstream MBS, the method comprising the steps of:

- receiving, on the part of the metadata encoder 2, at least one dynamic range control gain sequence DS comprising one or more dynamic range control gains for a dynamic range control stage 5 of an audio decoder 3;
- receiving, on the part of the metadata encoder 2, at least one guided clipping prevention gain sequence GS comprising one or more guided clipping prevention gains for a guided clipping prevention stage 6 of the audio decoder 3; and
- including, on the part of the metadata encoder 2, at least one of said dynamic range control gain sequences DS and at least one of said guided clipping prevention gain sequences GS into the metadata bitstream MBS.

In a further aspect the invention provides a computer program for performing, when running on a computer or a processor, the before-mentioned method.

The following figures for decoder side processing are based on the proposal for a 3D audio coding approach as presented in [M30324].

FIG. 2 illustrates a first embodiment of an audio decoder 3 according to the invention in a schematic view.

The audio decoder 3 for decoding an audio bitstream and a metadata bitstream MBS related to the audio bitstream, which are produced in particular by an audio encoder 1 according to the present invention, the audio decoder 3 comprising:

- an audio processing chain 4 configured to receive a decoded audio signal DAS derived from the audio bitstream and configured to adjust characteristics of an audio output signal AOS of the audio processing chain 4, the audio processing chain 4 comprising a plurality of adjustment stages 5, 6, 10, 11, 12, 13, 14 (see also FIG. 3, 4, 5) including a dynamic range control stage 5 for adjusting a dynamic range of the audio output signal AOS and a guided clipping prevention stage 6 for preventing of clipping of the audio output signal AOS; and
- a metadata decoder 7 configured to receive the metadata bitstream MBS and configured to extract dynamic range control gain sequences DS and guided clipping prevention gain sequences GS from the metadata bitstream MBS, at least a part of the dynamic range control gain sequences DS being supplied to the dynamic range control stage 5, and at least a part of the guided clipping prevention gain sequences GS being supplied to the guided clipping prevention stage 6.

The metadata decoder 7 receives the metadata bitstream MBS containing the compressed dynamic range control gain sequences DS and guided clipping prevention gain sequences GS, for example from a unified speech and audio coding decoder.

The metadata decoder 7 generates the uncompressed dynamic range control gain sequence DS from the compressed metadata bitstream MBS. Additionally, scaling or mapping of the resulting dynamic range control gains may be applied.

The metadata decoder 7 additionally generates the uncompressed guiding clipping prevention gain sequences GS from the bitstream MBS containing compressed guided clipping prevention metadata. A scaling or mapping of the guided clipping prevention gains can be applied. This is especially useful if the audio decoder target level is lower than the target level that has been used for determining the guided clipping prevention gains sequence GS at the audio encoder 1. Then, mapping of the guided clipping prevention gains is possible, which optimally restores signal headroom while still assuring that no clipping occurs at the audio decoder output signal AOS.

The dynamic range control stage 5 receives the uncompressed and optionally scaled or mapped dynamic range control gain sequences DS for each audio frame directly or indirectly from the metadata decoder 7. The metadata decoder 7 also may ensure that the final time-domain dynamic range control gain values are interpolated with a temporal resolution corresponding to the temporal resolution of the audio samples. These final dynamic range control gains may then be applied to the decoded audio signal DAS, where assignment of a certain dynamic range control sequence to the channels and/or objects is observed.

The guided clipping prevention stage 6 receives the uncompressed and optionally scaled or mapped guided clipping prevention gain sequences GS for each audio frame directly or indirectly from the metadata decoder 7. The metadata decoder 7 may also ensure that the final time-domain guided clipping prevention gain values are interpolated with a temporal resolution corresponding to the temporal resolution of the audio samples. These final guiding clipping prevention gains may then be applied to the decoded audio signals or to signals ISG (or IGS in FIG. 3, FIG. 4 and FIG. 5) derived from the decoded audio signals DAS, where assignment of a certain guided clipping prevention sequence to the channels and/or objects is observed.

The invention provides flexibility at the audio decoder side while leaving the control of the entire processing chain at the encoder side. The separation of the metadata used for dynamic range control and guided clipping prevention allows for separate modification (scaling or mapping) of each of the gains, said modification depending on the audio decoder configuration and the playback scenario.

The invention allows changing the underlying dynamic range control characteristic of a dynamic range control gain sequence DS from heavy compression to light compression if the dynamic range control gains are transmitted separately from the guided clipping prevention gains. This can be achieved by means of appropriate scaling or mapping of the values of the dynamic range control gain sequence DS.

In the event that the decoder target level is lower than the target level used for computing the gains for guided clipping prevention at the audio encoder 1, reduced attenuation of signal peaks can be allowed at the audio decoder 3 by appropriately scaling the guided clipping prevention gains. Then, the level of strong signal peaks can be maintained or at least be increased as compared to the case of applying the guided clipping prevention gains in an unmodified manner, which means that available headroom can be preserved.

According to an embodiment of the invention the metadata decoder 7 is configured to extract from the metadata bitstream MBS at least two dynamic range control gain sequences DS for the same audio frame comprising different dynamic range control gains.

The information about which dynamic range control characteristics are associated with the different dynamic range control gain sequences DS may be included in the dynamic range control instruction contained in the file header in case of file based delivery or in the unified speech and audio coding configuration extensions.

By means of these features it is possible to provide multiple dynamic range control gain sequences DS for the channels of an audio track in order to enable audio output signals AOS at the decoder 1 which have different compression characteristics.

According to an embodiment of the invention the metadata decoder 7 is configured to extract from the metadata bitstream MBS a dynamic range control gain sequence DS comprising at least two dynamic range control gains related to different frequency bands of the audio decoder 3.

In an optional extension supporting multi-band dynamic range control, the metadata decoder 7 can be extended to also accept, as input, dynamic range control gain sequences DS having different dynamic range control gains for different frequency bands.

In case of a multi-band dynamic range control extension, the time-domain audio signal has to be transformed into the appropriate frequency domain representation before applying multi-band dynamic range control gains.

The information about which dynamic range control characteristics are associated with the different dynamic range control gain sequences DS may be included in the dynamic range control instruction contained in the file header in case of file based delivery or in the unified speech and audio coding configuration extensions.

According to an embodiment of the invention the metadata decoder 7 is configured to extract from the metadata bitstream MBS at least two guided clipping prevention gain sequences GS comprising different guided clipping prevention gains.

By means of these features it is possible to provide multiple guided clipping prevention gain sequences GS for an audio track in order to match the corresponding dynamic range control gain sequences DS.

In a further aspect the invention provides a method for operating an audio decoder 3, in particular an audio decoder 3 according to the invention, for decoding an audio bitstream and a metadata bitstream MBS related to the audio bitstream, which are produced in particular by an audio encoder according to the invention, the method comprises the steps of:

- deriving a decoded audio signal DAS from the audio bitstream;
- using an audio processing chain for having a plurality of adjusting stages 5, 6, 10, 11, 12, 13, 14 for adjusting characteristics of an audio output signal AOS of the audio processing chain 4 including adjusting a dynamic range of the audio output signal AOS by a dynamic range control stage 5, which is an adjustment stage 5 of the adjustment chain 4 and preventing of clipping of the audio output signal AOS by a guided clipping prevention stage 6, which is an adjustment stage 6 of the adjustment chain 4;
- receiving, on the part of a metadata decoder 7, the metadata bitstream MBS and extracting dynamic range control gain sequences DS and guided clipping prevention gain sequences GS from the metadata bitstream MBS;

supplying at least a part of the dynamic range control gain sequences DS to the dynamic range control stage 5; and supplying at least a part of the guided clipping prevention gain sequences GS to the guided clipping prevention stage 6.

In a further aspect the invention provides a computer program for performing, when running on a computer or a processor, the before-mentioned method.

Figure 3:
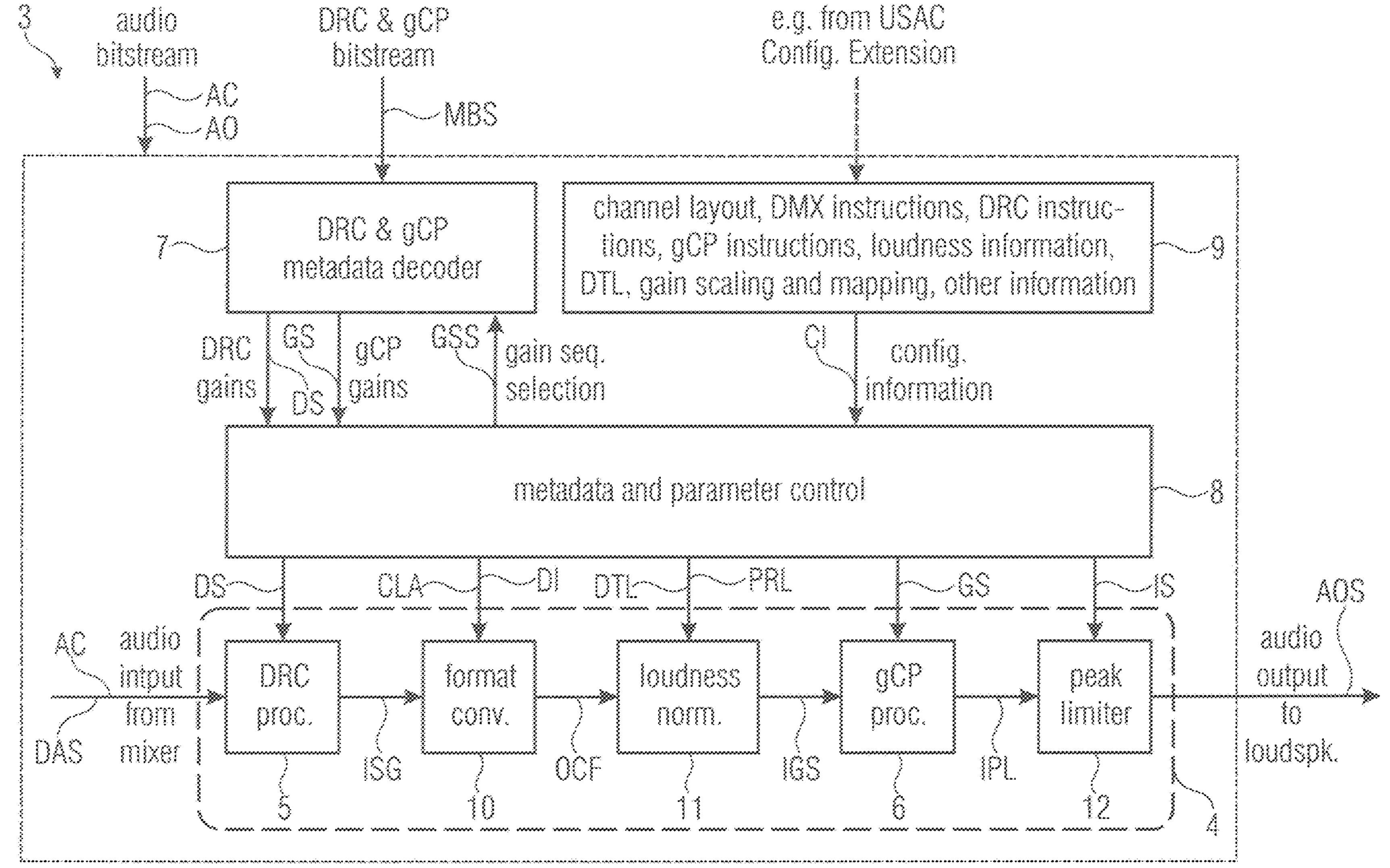
FIG. 3 illustrates a second embodiment of an audio decoder according to the invention in a schematic view.

FIG. 3 illustrates a second embodiment of an audio decoder 3 according to the invention in a schematic view.

According to an embodiment of the invention the metadata decoder 7 is configured to extract from the metadata bitstream MBS a dynamic range control gain sequence DS comprising at least two dynamic range control gains related to different audio channels.

Within each dynamic range control sequence DS it is possible to define a set of different dynamic range control gains for different channels or groups of channels, each channel usually being associated with exactly one channel group. For example, in multi-channel movie sound it is often desired to apply a specific dynamic range control gain to the dialog channel. The remaining channels such as front left, front right, rear left, rear right, for example, may be processed by using a different dynamic range control gain.

According to an embodiment of the invention the metadata decoder 7 is configured to extract from the metadata bitstream MBS a guided clipping prevention gain sequence GS comprising at least two guided clipping prevention gains related to different audio channels.

As with the dynamic range control gains, it is possible to define a set of different guided clipping prevention gains for different channels or groups of channels within each guided clipping prevention sequence, where each channel usually is associated with exactly one channel group. In typical operation modes the same guided clipping prevention gains are applied to all channels.

Figure 4:
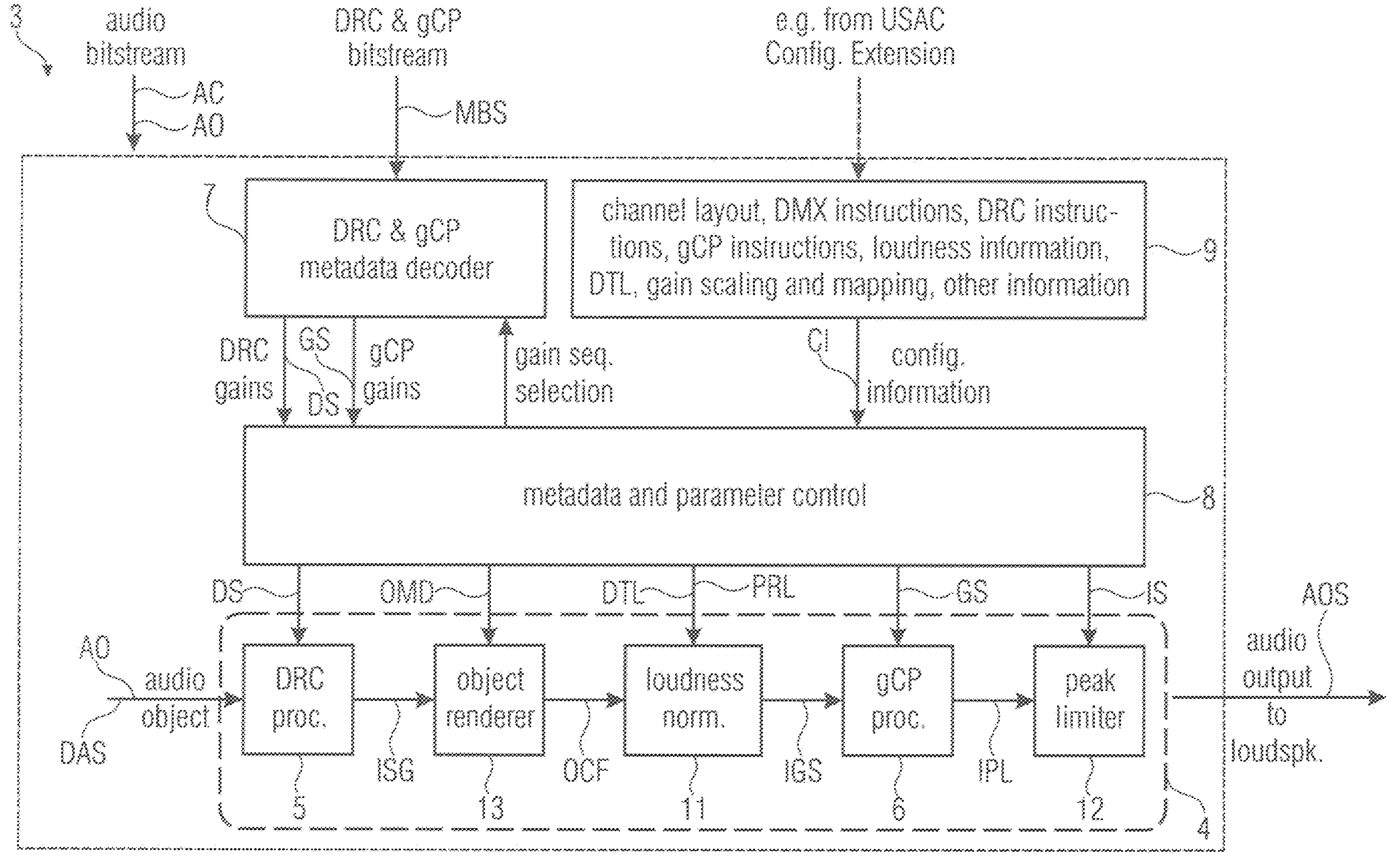
FIG. 4 illustrates a third embodiment of an audio decoder according to the invention in a schematic view.
Figure 5:
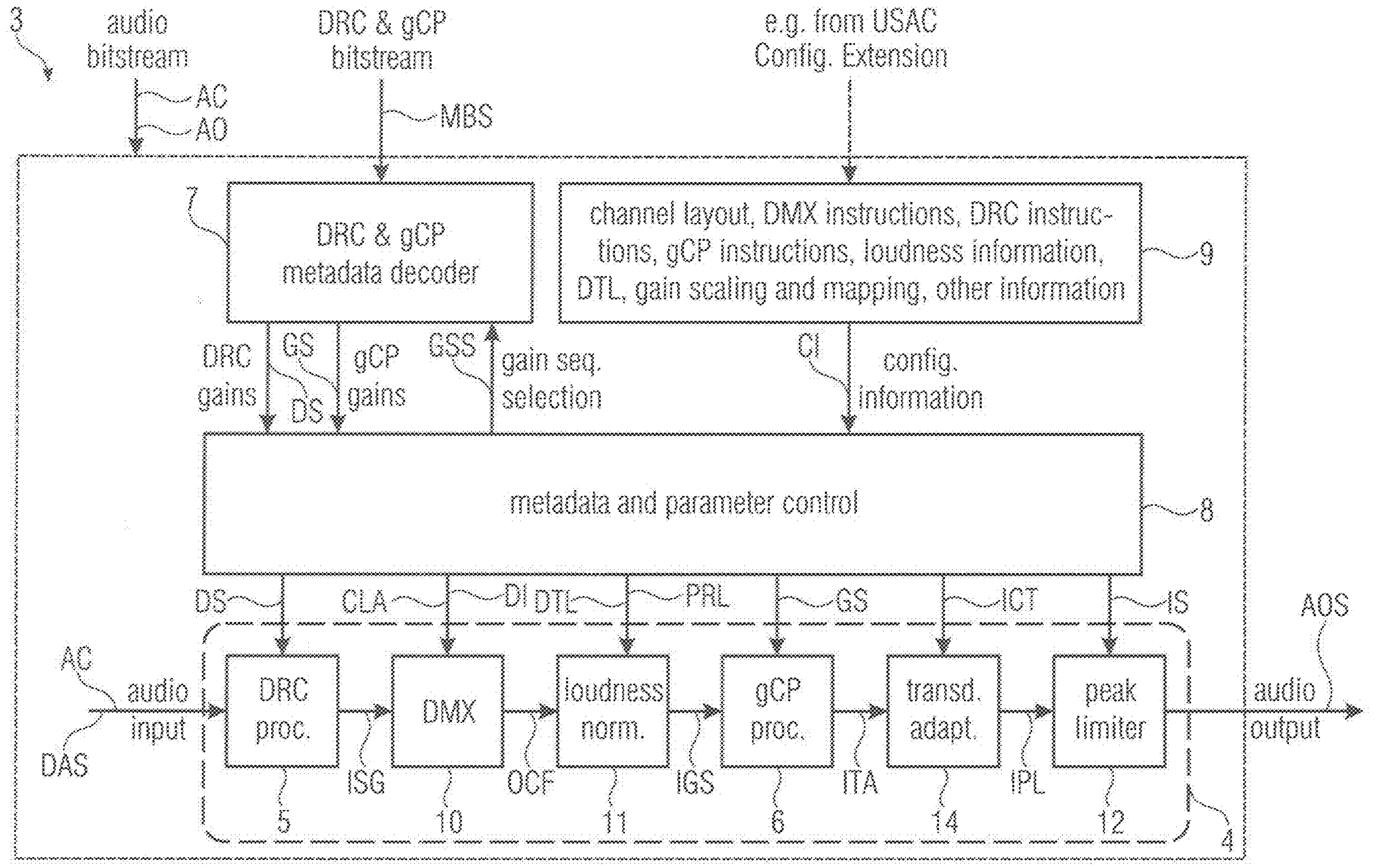
FIG. 5 illustrates a forth embodiment of an audio decoder according to the invention in a schematic view.

According to an embodiment of the invention the audio decoder 3 further comprises a metadata and parameter control stage 8 configured to provide metadata and parameters DS, GS, CLA, DI, DTL, PRL, IS, OMD, ICT to at least one of the adjustment stages 5, 6, 10, 11, 12, 13, 14 on the basis of configuration information received from a configuration providing stage 9 (see also FIGS. 4 and 5).

The metadata and parameter control stage 8 at the audio decoder may select the correct part of the metadata bitstream MBS in accordance with the desired dynamic range control gain sequences DS by sending a gain sequence selection signal GSS to the metadata decoder 7. The scaling and mapping information can also be part of or derived from the decoder configuration information Cl.

By analogy, the metadata and parameter control stage 8 at the audio decoder 3 selects the correct part of the bitstream MBS in accordance with the desired guided clipping prevention gain sequences GS.

According to an embodiment of the invention the metadata and parameter control stage 8 is configured to select, in the event that a plurality of dynamic range control gain sequences DS is received, which of the plurality of dynamic range control gain sequences DS is supplied to the dynamic range control stage 5. The selection of the dynamic range control sequences DS on the part of the metadata and parameter control stage 8 can be based on the decoder configuration information Cl such as channel layout CLA, downmix instructions DI, object metadata OMD (see FIG. 4), dynamic range control instructions, loudness information PRL, and decoder target level DTL, and may be executed by sending a gain sequence selection signal GSS to the metadata decoder 7.

According to an embodiment of the invention the metadata and parameter control stage 8 is configured to select, in the event that a plurality of guided clipping prevention gain sequences GS is received, which of the plurality of guided clipping prevention gain sequences GS is supplied to the guided clipping prevention stage 6.

The selection of the guided clipping prevention gain sequence GS on the part of the metadata and parameter control block 8 is usually based on audio decoder configuration information Cl described above.

According to an embodiment of the invention the dynamic range control stage 5 in the direction of the signal flow is the first adjustment stage of the audio adjustment chain 4.

Dynamic range control processing for channels may be performed before a potential downmixing or format conversion of the decoded audio channels AC in order to enable different gaining for the channel groups. Accordingly, the dynamic range control gains are applied to the objects AO before rendering (see FIG. 4). In the event that both—channels AC and objects AO—are present, the location of the dynamic range control processing remains the same: the channel related dynamic range control should be performed directly before the format converter stage 10 (see FIG. 4), whereas the object related dynamic range control is performed before the object renderer 13 (see FIG. 4).

According to an embodiment of the invention the audio adjustment chain 4 comprises a format converter stage 10 configured to adjust a channel configuration of the audio output signal AOS. The format converter stage 10, also referred to as downmixer (DMX), is configured to adapt the channel configuration of the audio output signal AOS to the transducers used for playback. For example, the format converter stage may convert a 5.1 surround signal into a stereo signal.

According to an embodiment of the invention the audio adjustment chain 4 comprises a loudness normalization stage 11 configured to normalize the loudness of the audio output signal AOS.

The loudness normalization stage 11 may scale its audio input signal OCF such that the output signal IGS has the correct target loudness level. The scaling factor is derived from the difference between the program reference level PRL and the decoder target level DTL and provided by the decoder's metadata and parameter control stage 8 to the loudness normalization stage 11. The program reference level PRL may be obtained from the loudness information included, e.g., in the file header, whereas the decoder target level is a decoder configuration parameter. It is possible that multiple program reference level PRL values are provided within the loudness information, where each corresponds to a specific configuration of an applied dynamic range control sequence DS and/or an applied downmix. In this case, the metadata and parameter control stage 8 chooses the correct program reference level value PRL while considering the given audio decoder configuration. The location of the loudness-processing step depends on the actual output configuration of the audio decoder 3. In general, the loudness normalization should be performed on the output channels of the audio decoder 3, e.g. after the mixer, or after format conversion stage 10, if applicable.

According to an embodiment of the invention the audio adjustment chain 4 comprises a peak limiter stage 12 configured to limit peaks of the audio output signal AOS in the event that a threshold is exceeded.

According to an embodiment of the invention the peak limiter stage 12 in the direction of the signal flow is the last adjustment stage of the audio adjustment chain 4.

There are a number of potential sources of unavoidable sample clipping in the audio processing chain 4 of a typical audio decoder, including:

Parametric coding tools

Binaural processing

Downmixing, format conversion, rendering

Loudness normalization (especially for high target levels)

Quantization at the decoder output

The peak limiter stage 12 is therefore placed at the very end of the processing chain 4 of the audio decoder 3 to prevent any undesired clipping of the audio samples, e.g. just before the time domain output signal is converted from the floating point to the fixed point pulse code modulation format (PCM format). This also means that any dynamic range control stage 5 and loudness normalization stage 11 described in the previous section is located before the peak limiter stage 12. In the context of MPEG-H 3D Audio [M30324], the peak limiter stage receives different signals IPL as input, depending on the actual playback configuration. In case of binaural rendering, the two output channels for the headphones may be processed by the peak limiter stage 12. If the output channels of the mixer are played back directly, the peak limiter stage 12 may process the corresponding loudspeaker channels. The same applies if the mixer output channels are converted to a different loudspeaker configuration (e.g. downmixed) by the format converter 10 first.

The peak limiter stage 12 may detect audio samples in the time-domain signal that exceed the limiting threshold, and applies a level reduction to the respective signal portions so that the samples of the audio output signal AOS stay below the limiting threshold. To prevent audible distortions, the level reduction should be performed gradually, i.e. the gain factor applied to the signal may only change slowly over time, which is ensured by a gain smoothing filter. A look-ahead delay of the input signal of the peak limiter stage before applying the limiter gain factor is also used in order to allow for a smooth reduction of the gain starting already before sharp signal peaks. The delay can be adjusted to a given requirement, a practical choice being 5 ms. In case of multi-channel audio a common gain factor may be applied to all audio channels to reduce computational complexity.

The information about the maximum peak IS of the audio signal DAS, which may be included in the loudness information of a file header, can be exploited to discard the peak limiter stage 12 if the decoder configuration implies that no clipping can occur in the audio processing chain. The peak limiter stage 12 may also be discarded, e.g., if the audio decoder 3 outputs audio samples with floating point precision, and clipping prevention is performed at a later point in the audio chain of the playback device. Obviously, if the decoder configuration for a given playback scenario allows application of correct guided clipping prevention gains, the peak limiter stage may also be disabled if no additional codec clipping occurs.

The peak limiter 12 may be considered as being an essential component in practice. There are numerous sources of clipping within the audio processing chain of the audio decoder 3. Special configurations may be covered by providing guided clipping prevention gain sequences. However, for flexible operation of the decoder, the peak limiter may be provided to assure that no clipping occurs.

As shown in FIG. 3, the guided clipping prevention processing may be performed after format conversion and loudness normalization of the audio channels. If no format conversion is applied, the guided clipping prevention gains may be directly applied to the output ISG of the dynamic range control stage 5.

FIG. 4 illustrates a third embodiment of an audio decoder according to the invention in a schematic view. FIG. 4 depicts a configuration of dynamic range control processing for audio objects AO. The dynamic range control processing is performed on the audio object signals before rendering. Loudness normalization and clipping prevention is performed after the object rendering to channels.

According to an embodiment of the invention the audio adjustment chain 4 comprises an object renderer stage 13 configured to mix audio objects AO into channels of the audio output signal AOS.

According to an embodiment of the invention the metadata decoder 7 is configured to extract from the metadata bitstream MBS a dynamic range control gain sequence DS comprising at least two dynamic range control gains related to different audio objects AO.

By analogy with the channel case, multiple dynamic range control sequences DS that are associated with audio objects or groups of objects can be supported. These object-related dynamic range control sequences can also be considered as being associated with a specific channel group within a channel-related set of dynamic range control gains. The term audio objects AO herein relates to single source sounds such as a door bell.

According to an embodiment of the invention the metadata decoder 7 is configured to extract from the metadata bitstream MBS a guided clipping prevention gain sequence GS comprising at least two guided clipping prevention gains related to different audio objects.

As with the dynamic range control gains, it is possible to define a set of different guided clipping prevention gains for different audio objects or groups of audio objects within each guided clipping prevention sequence, where each channel usually is associated with exactly one audio object. In typical operation modes the same guided clipping prevention gains are applied to all audio objects.

The definitions of guided clipping prevention gain sequences for objects are analogous to the dynamic range control case.

FIG. 5 illustrates a forth embodiment of an audio decoder according to the invention in a schematic view.

Another realization of the concept is shown in FIG. 5, where an additional transducer adaptation block 14 is included before the peak limiter 12. The format converter stage 10 refers to a downmixing processing step or a format conversion between different input/output channel configurations. By analogy, the transducer adaptation block can be included in a object-related processing chain according to FIG. 4.

According to an embodiment of the invention the audio adjustment chain 4 comprises a transducer adaption stage 14 configured to adjust characteristics of the audio output signal AOS to a transducer system used for reproducing the audio output signal.

In order to reduce the necessitated limiting strength of the peak limiter stage 12, frequency dependent transducer adaptation processing, e.g. implemented by an equalization filter, can be included in the processing chain 4.

The transducer adaptation stage 14 receives an audio input signal ITA and information ICT about the characteristics of the transducer used for reproduction (loudspeaker or headphones).

The task of the transducer adaption stage 14 is to adapt the audio output signal AOS to the transducer characteristics, especially when transducers have a limited frequency range and thereby will limit the frequency range of the audio output signal. By limiting the frequency range by using appropriate filters mimicking the transfer function of the transducer prior to the peak limiting stage 12, the input signal IPL of the peak limiter stage is reduced in level. As a consequence, signal peaks that exceed the limiting thresholds are reduced in level. Consequently, the effect of the peak limiting stage 12 is less severe. This is advantageous because

- peak limiting can audibly change the signal, whereas the transducer adaptation does not introduce audible changes into the signal, and
- when signals are modified such that the maximum peak level is below the limiting threshold, the peak limiter will introduce less computational load.

In addition to the filtering, the transducer adaptation stage 14 can also include signal-adaptive processing such that the band-limiting of the transducer is compensated for. Especially very small transducers are not capable of reproducing low-frequency signals.

This can be compensated for by increasing the perceived bass response of the transducer, e.g. by artificially generating and adding harmonics of the low-frequency notes to the signal.

With respect to the decoder, the encoder, and the methods of the described embodiments the following shall be noted:

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Embodiments of the invention comprise an audio encoder for producing an audio bitstream comprising one or more audio channels (AC) and/or one or more audio objects (AO), the audio encoder comprising a metadata encoder for producing a metadata bitstream (MBS), the audio encoder being configured to receive at least one dynamic range control gain sequence (DS) for an audio frame comprising one or more dynamic range control gains for a dynamic range control stage of an audio decoder; to receive at least one guided clipping prevention gain sequence (GS) for the audio frame comprising one or more guided clipping prevention gains for a guided clipping prevention stage of the audio decoder; and to include at least one of said dynamic range control gain sequences (DS) and at least one of said guided clipping prevention gain sequences (GS) into the metadata bitstream (MBS).

Embodiments of the invention comprise an audio encoder according to the immediately preceding embodiment, wherein the metadata encoder is configured to receive at least two dynamic range control gain sequences (DS) for the same audio frame comprising different dynamic range control gains, and to include the at least two dynamic range control gain sequences (DS) comprising different dynamic range control gains into the metadata bitstream (MBS).

Embodiments of the invention comprise an audio encoder according to any of the two immediately preceding embodiments, wherein the metadata encoder is configured to receive a dynamic range control gain sequence (DS) comprising at least two dynamic range control gains related to different audio channels and/or to different audio objects, and to include the dynamic range control gain sequence (DS) comprising at least two dynamic range control gains related to different audio channels and/or to different audio objects and, optionally, the relationships of the dynamic range control gains to the audio channels and/or the audio objects into the metadata bitstream (MBS).

Embodiments of the invention comprise an audio encoder according to any of the three immediately preceding embodiments, wherein the metadata encoder is configured to receive a dynamic range control gain sequence (DS) comprising at least two dynamic range control gains related to different frequency bands of the audio decoder, and to include the dynamic range control gain sequence (DS) comprising at least two dynamic range control gains related to different frequency bands of the decoder and, optionally, the relationships of the dynamic range control gains to the frequency bands of the decoder into the metadata bitstream (MBS).

Embodiments of the invention comprise an audio encoder according to any of the four immediately preceding embodiments, wherein the metadata encoder is configured to receive at least two guided clipping prevention gain sequences (GS) comprising different guided clipping prevention gains, and to include the at least two guided clipping prevention gain sequences (GS) comprising the different guided clipping prevention gains into the metadata bitstream (MBS).

Embodiments of the invention comprise an audio encoder according to any of the five immediately preceding embodiments, wherein each dynamic range control sequence (DS) is related to one of the guided clipping prevention gain sequences (GS), wherein the metadata encoder (2) is configured to include relationships between the dynamic range control sequences (DS) and the guided clipping prevention gain sequences (GS) into the metadata bitstream (MBS).

Embodiments of the invention comprise an audio encoder according to any of the six immediately preceding embodiments, wherein the metadata encoder is configured to receive a guided clipping prevention gain sequence (GS) comprising at least two guided clipping prevention gains related to different audio channels and/or to different audio objects, and to include the guided clipping prevention gain sequence (GS) comprising at least two guided clipping prevention gains related to different audio channels and/or to different audio objects and, optionally, the relationships of the guided clipping prevention gains to the audio channels and/or the audio objects into the metadata bitstream (MBS).

Embodiments of the invention comprise a method for operating an audio encoder for producing an audio bitstream comprising one or more audio channels and/or one or more audio objects, the audio encoder comprising a metadata encoder for producing a metadata bitstream (MBS), the method comprising the steps of: receiving, on the part of the metadata encoder, at least one dynamic range control gain sequence (DS) comprising one or more dynamic range control gains for a dynamic range control stage of an audio decoder; receiving, on the part of the metadata encoder, at least one guided clipping prevention gain sequence (GS) comprising one or more guided clipping prevention gains for a guided clipping prevention stage of the audio decoder; and including, on the part of the metadata encoder at least one of said dynamic range control gain sequences (DS) and at least one of said guided clipping prevention gain sequences (GS) into the metadata bit-stream (MBS).

Embodiments of the invention comprise a computer program for performing, when running on a computer or a processor, the method of the immediately preceding embodiment.

Embodiments of the invention comprise an audio decoder for decoding an audio bitstream and a metadata bit-stream (MBS) related to the audio bitstream, which are produced in particular by an audio encoder according to any of the eight embodiments preceding the immediately preceding embodiment, the audio decoder comprising: an audio processing chain configured to receive a decoded audio signal (DAS) derived from the audio bitstream and to adjust characteristics of an audio output signal (AOS) of the audio processing chain, the audio processing chain comprising a plurality of adjustment stages including a dynamic range control stage for adjusting a dynamic range of the audio output signal (AOS) and a guided clipping prevention stage for preventing of clipping of the audio output signal (AOS); and a metadata decoder configured to receive the metadata bitstream (MBS) and to extract dynamic range control gain sequences (DS) and guided clipping prevention gain sequences (GS) from the metadata bit-stream (MBS), at least a part of the dynamic range control gain sequences (DS) being supplied to the dynamic range control stage, and at least a part of the guided clipping prevention gain sequences (GS) being supplied to the guided clipping prevention stage.

Embodiments of the invention comprise an audio decoder according to the immediately preceding embodiment, wherein the metadata decoder is configured to extract from the metadata bitstream (MBS) at least two dynamic range control gain sequences (DS) for the same audio frame comprising different dynamic range control gains.

Embodiments of the invention comprise an audio decoder according to any of the two immediately preceding embodiments, wherein the metadata decoder is configured to extract from the metadata bitstream (MBS) a dynamic range control gain sequence (DS) comprising at least two dynamic range control gains related to different audio channels and/or to different audio objects.

Embodiments of the invention comprise an audio decoder according to any of the three immediately preceding embodiments, wherein the metadata decoder is configured to extract from the metadata bit-stream (MBS) a dynamic range control gain sequence (DS) comprising at least two dynamic range control gains related to different frequency bands of the audio decoder.

Embodiments of the invention comprise an audio decoder according to any of the four immediately preceding embodiments, wherein the metadata decoder is configured to extract from the metadata bit-stream (MBS) at least two guided clipping prevention gain sequences (GS) comprising different guided clipping prevention gains.

Embodiments of the invention comprise an audio decoder according to any of the five immediately preceding embodiments, wherein the metadata decoder is configured to extract from the metadata bit-stream (MBS) a guided clipping prevention gain sequence (GS) comprising at least two guided clipping prevention gains related to different audio channels and/or to different audio objects.

Embodiments of the invention comprise an audio decoder according to any of the six immediately preceding embodiments, the audio decoder further comprising a metadata and parameter control stage (8) configured to provide metadata and parameters (DS, GS, CLA, DI, DTL, PRL, IS, OMD, ICT) to at least one of the adjustment stages on the basis of configuration information (CI) received from a configuration providing stage.

Embodiments of the invention comprise an audio decoder according to any of the seven immediately preceding embodiments, wherein the metadata and parameter control stage is configured to select, in the event that a plurality of dynamic range control gain sequences (DS) is received, which of the plurality of dynamic range control gain sequences (DS) is supplied to the dynamic range control stage.

Embodiments of the invention comprise an audio decoder according to any of the eight immediately preceding embodiments, wherein the metadata and parameter control stage is configured to select, in the event that a plurality of guided clipping prevention gain sequences (GS) is received, which of the plurality of guided clipping prevention gain sequences (GS) is supplied to the guided clipping prevention stage.

Embodiments of the invention comprise an audio decoder according to any of the nine immediately preceding embodiments, wherein the dynamic range control stage in the direction of the signal flow is the first adjustment stage of the audio adjustment chain.

Embodiments of the invention comprise an audio decoder according to any of the ten immediately preceding embodiments, wherein the audio adjustment chain comprises a format converter stage configured to adjust a channel configuration of the audio output signal (AOS).

Embodiments of the invention comprise an audio decoder according to any of the eleven immediately preceding embodiments, wherein the audio adjustment chain comprises a loudness normalization stage configured to normalize the loudness of the audio output signal (AOS).

Embodiments of the invention comprise an audio decoder according to any of the twelve immediately preceding embodiments, wherein the audio adjustment chain comprises a peak limiter stage configured to limit peaks of the audio output (AOS) in the event that a threshold is exceeded.

Embodiments of the invention comprise an audio decoder according to any of the thirteen immediately preceding embodiments, wherein the audio adjustment chain comprises an object renderer stage configured to mix audio objects into channels of the audio output signal (AOS).

Embodiments of the invention comprise an audio decoder according to any of the fourteen immediately preceding embodiments, wherein the audio adjustment chain comprises a transducer adaption stage configured to adjust characteristics of the audio output signal (AOS) to a transducer system used for reproducing the audio output signal (AOS).

Embodiments of the invention comprise an audio decoder according to any of the fifteen immediately preceding embodiments, wherein the peak limiter stage in the direction of the signal flow is the last adjustment stage of the audio adjustment chain.

Embodiments of the invention comprise a method for operating an audio decoder, in particular an audio decoder according to any of the sixteen immediately preceding embodiments, for decoding an audio bit-stream and a metadata bitstream (MBS) related to the audio bitstream, which are produced in particular by an audio encoder according to any of the eight embodiments immediately preceding the eighteen immediately embodiments, the method comprising the steps of deriving a decoded audio signal (DAS) from the audio bitstream; using an audio processing chain having a plurality of adjusting stages for adjusting characteristics of an audio output signal (AOS) of the audio processing chain including adjusting a dynamic range of the audio output signal (AOS) by a dynamic range control stage, which is an adjustment stage of the adjustment chain, and preventing of clipping of the audio output signal (AOS) by a guided clipping prevention stage, which is an adjustment stage of the adjustment chain; receiving, on the part of a metadata decoder, the metadata bit-stream (MBS) and extracting dynamic range control gain sequences (DS) and guided clipping prevention gain sequences (GS) from the metadata bitstream (MBS); supplying at least a part of the dynamic range control gain sequences (DS) to the dynamic range control stage; and supplying at least a part of the guided clipping prevention gain sequences (GS) to the guided clipping prevention stage.

Embodiments of the invention comprise a computer program for performing, when running on a computer or a processor, the method of the immediately preceding embodiment.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, which is stored on a machine readable carrier or a non-transitory storage medium.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may be configured, for example, to be transferred via a data communication connection, for example via the Internet.

A further embodiment comprises a processing means, for example a computer, or a programmable logic device, configured or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[M30100] ISO/IEC JTC1/SC29/WG11 M30100, "Proposed Revision of Audio aspects of WD: Addition of Sample aspect ratio and further audio code-points", July 2013, Vienna

[M30101] ISO/IEC JTC1/SC29/WG11 M30101, "Editors draft of 14496-12 PDAM 3-Enhanced audio and other improvements", July 2013, Vienna

[M30324] ISO/IEC JTC1/SC29/WG11 M30324, "Description of the Fraunhofer IIS Submission for the 3D-Audio CfP", July 2013, Vienna

[M28901] ISO/IEC JTC1/SC29/WG11 M28901, "Enhanced Metadata for Dynamic Range Compression", April 2013, Incheon, Korea

The invention claimed is:

1. An audio decoder for decoding an audio bitstream and a metadata bitstream related to the audio bitstream, the audio decoder comprising:

an audio processing chain configured to receive a decoded audio signal derived from the audio bitstream and to adjust characteristics of an audio output signal of the audio processing chain, the audio processing chain comprising a plurality of adjustment stages including a dynamic range control stage for adjusting a dynamic range of the audio output signal and a guided clipping prevention stage for preventing of clipping of the audio output signal at the audio decoder;

a metadata decoder configured to receive the metadata bitstream and to extract dynamic range control gain sequences and guided clipping prevention gain sequences from the metadata bitstream, at least a part of the dynamic range control gain sequences being supplied to the dynamic range control stage, and at least a part of the guided clipping prevention gain sequences being supplied to the guided clipping prevention stage; and a metadata and parameter control stage configured to provide metadata and parameters to at least one of the adjustment stages on the basis of configuration information received from a configuration providing stage;

wherein the guided clipping prevention stage receives the guided clipping prevention gain sequences from the metadata and parameter control stage in an uncompressed form, wherein final time-domain guided clipping prevention gain values are interpolated with a temporal resolution corresponding to the temporal resolution of the decoded audio signal, wherein the final guiding clipping prevention gains are applied to the decoded audio signal, where an assignment of one of the final guided clipping prevention sequences to channels and/or objects is observed.

2. The audio decoder according to claim 1, wherein the metadata decoder is configured to extract from the metadata bitstream at least two dynamic range control gain sequences for the same audio frame comprising different dynamic range control gains.

3. The audio decoder according to claim 1, wherein the metadata decoder is configured to extract from the metadata bitstream a dynamic range control gain sequence comprising at least two dynamic range control gains related to different audio channels and/or to different audio objects.

4. The audio decoder according to claim 1, wherein the metadata decoder is configured to extract from the metadata bitstream a dynamic range control gain sequence comprising at least two dynamic range control gains related to different frequency bands of the audio decoder.

5. The audio decoder according to claim 1, wherein the metadata decoder is configured to extract from the metadata bitstream at least two guided clipping prevention gain sequences comprising different guided clipping prevention gains.

6. The audio decoder according to claim 1, wherein the metadata decoder is configured to extract from the metadata bitstream a guided clipping prevention gain sequence comprising at least two guided clipping prevention gains related to different audio channels and/or to different audio objects.

7. The audio decoder according to claim 1, the audio decoder further comprising the metadata and parameter control stage configured to provide metadata and parameters to at least one of the adjustment stages on the basis of configuration information received from the configuration providing stage.

8. The audio decoder according to claim 7, wherein the metadata and parameter control stage is configured to select, in the event that a plurality of dynamic range control gain sequences is received, which of the plurality of dynamic range control gain sequences is supplied to the dynamic range control stage.

9. The audio decoder according to claim 1, wherein the metadata and parameter control stage is configured to select, in the event that a plurality of guided clipping prevention gain sequences is received, which of the plurality of guided clipping prevention gain sequences is supplied to the guided clipping prevention stage.

10. The audio decoder according to claim 1, wherein the dynamic range control stage in a direction of a signal flow is a first adjustment stage of the audio processing chain.

11. The audio decoder according to claim 1, wherein the audio processing chain comprises a format converter stage configured to adjust a channel configuration of the audio output signal.

12. The audio decoder according to claim 1, wherein the audio processing chain comprises a loudness normalization stage configured to normalize the loudness of the audio output signal.

13. The audio decoder according to claim 1, wherein the audio processing chain comprises a peak limiter stage configured to limit peaks of the audio output in the event that a threshold is exceeded.

14. The audio decoder according to claim 13, wherein the peak limiter stage in the direction of the signal flow is the last adjustment stage of the audio adjustment chain.

15. The audio decoder according to claim 1, wherein the audio processing chain comprises an object renderer stage configured to mix audio objects into channels of the audio output signal.

16. The audio decoder according to claim 1, wherein the audio processing chain comprises a transducer adaption stage configured to adjust characteristics of the audio output signal to a transducer system used for reproducing the audio output signal.

17. A method for operating an audio decoder, for decoding an audio bitstream and a metadata bitstream related to the audio bitstream, the method comprising:

deriving a decoded audio signal from the audio bitstream;

using an audio processing chain comprising a plurality of adjusting stages for adjusting characteristics of an audio output signal of the audio processing chain including adjusting a dynamic range of the audio output signal by a dynamic range control stage, which is an adjustment stage of the audio processing chain, and preventing of clipping of the audio output signal at the audio decoder by a guided clipping prevention stage, which is an adjustment stage of the audio processing chain;

receiving, on the part of a metadata decoder, the metadata bitstream and extracting dynamic range control gain sequences and guided clipping prevention gain sequences from the metadata bitstream;

supplying at least a part of the dynamic range control gain sequences to the dynamic range control stage;

supplying at least a part of the guided clipping prevention gain sequences to the guided clipping prevention stage;

using a metadata and parameter control stage for providing metadata and parameters to at least one of the adjustment stages on the basis of configuration information received from a configuration providing stage; and using the guided clipping prevention stage for receiving the guided clipping prevention gain sequences from the metadata and parameter control stage in an uncompressed form, wherein final time-domain guided clipping prevention gain values are interpolated with a temporal resolution corresponding to the temporal resolution of the de-coded audio signal, wherein the final guiding clipping prevention gains are applied to the decoded audio signal, where an assignment of one of the final guided clipping prevention sequences to channels and/or objects is observed.

18. A non-transitory digital storage medium having a computer program stored thereon to perform a method for operating an audio decoder, for decoding an audio bitstream and a metadata bitstream related to the audio bitstream, the method comprising:

deriving a decoded audio signal from the audio bitstream;

using an audio processing chain comprising a plurality of adjusting stages for adjusting characteristics of an audio output signal of the audio processing chain including adjusting a dynamic range of the audio output signal by a dynamic range control stage, which is an adjustment stage of the audio processing chain, and preventing of clipping of the audio output signal at the audio decoder by a guided clipping prevention stage, which is an adjustment stage of the audio processing chain;

receiving, on the part of a metadata decoder, the metadata bitstream and extracting dynamic range control gain sequences and guided clipping prevention gain sequences from the metadata bitstream;

supplying at least a part of the dynamic range control gain sequences to the dynamic range control stage; and supplying at least a part of the guided clipping prevention gain sequences to the guided clipping prevention stage;

using a metadata and parameter control stage for providing metadata and parameters to at least one of the adjustment stages on the basis of configuration information received from a configuration providing stage; and using the guided clipping prevention stage for receiving the guided clipping prevention gain sequences from the metadata and parameter control stage in an uncompressed form, wherein final time-domain guided clipping prevention gain values are interpolated with a temporal resolution corresponding to the temporal resolution of the de-coded audio signal, wherein the final guiding clipping prevention gains are applied to the decoded audio signal, where an assignment of one of the final guided clipping prevention sequences to channels and/or objects is observed, when said computer program is run by a computer.

* * * * *